United States Patent
Huegerich et al.

(10) Patent No.: US 11,215,776 B2
(45) Date of Patent: Jan. 4, 2022

(54) POWER AND OPTICAL FIBER INTERFACE

(71) Applicant: COMMSCOPE TECHNOLOGIES LLC, Hickory, NC (US)

(72) Inventors: Thomas P. Huegerich, Fuquay Varina, NC (US); Wayne M. Kachmar, North Bennington, VT (US); Robert Charles Flaig, Lancaster, PA (US); Dwight A. Bretz, Hummelstown, PA (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 0 days.

(21) Appl. No.: 16/704,964

(22) Filed: Dec. 5, 2019

(65) Prior Publication Data

US 2020/0209497 A1 Jul. 2, 2020

Related U.S. Application Data

(63) Continuation of application No. 15/985,068, filed on May 21, 2018, now Pat. No. 10,502,912, which is a
(Continued)

(51) Int. Cl.
*G02B 6/44* (2006.01)
*G02B 6/42* (2006.01)
(Continued)

(52) U.S. Cl.
CPC ......... *G02B 6/4416* (2013.01); *G02B 6/426* (2013.01); *G02B 6/4278* (2013.01); *G02B 6/4284* (2013.01); *G02B 6/4448* (2013.01); *H05K 5/0204* (2013.01); *G02B 6/3817* (2013.01); *G02B 6/4495* (2013.01); *H01B 11/22* (2013.01)

(58) Field of Classification Search
None
See application file for complete search history.

(56) References Cited

U.S. PATENT DOCUMENTS

| 4,089,585 A | 5/1978 | Slaughter |
| 4,199,225 A | 4/1980 | Slaughter |

(Continued)

FOREIGN PATENT DOCUMENTS

| AU | 2008309134 A1 | 6/2009 |
| AU | 2010201456 A1 | 5/2010 |

(Continued)

OTHER PUBLICATIONS

European Search Report for Application No. 14808346.2 dated Oct. 26, 2016.
(Continued)

*Primary Examiner* — Michael Stahl
(74) *Attorney, Agent, or Firm* — Merchant & Gould P.C.

(57) ABSTRACT

A power and optical fiber interface system includes a housing having an interior. A cable inlet is configured to receive a hybrid cable having an electrical conductor and an optical fiber. An insulation displacement connector (IDC) is situated in the interior of the housing configured to electrically terminate the conductor, and a cable outlet is configured to receive an output cable that is connectable to the IDC and configured to output signals received via the optical fiber.

34 Claims, 9 Drawing Sheets

Related U.S. Application Data continuation of application No. 15/373,709, filed on Dec. 9, 2016, now Pat. No. 9,977,208, which is a continuation of application No. 14/331,873, filed on Jul. 15, 2014, now Pat. No. 9,557,505, which is a continuation-in-part of application No. PCT/US2014/030969, filed on Mar. 18, 2014.

(60) Provisional application No. 61/846,392, filed on Jul. 15, 2013, provisional application No. 61/802,989, filed on Mar. 18, 2013.

(51) Int. Cl.
    *H05K 5/02* (2006.01)
    *G02B 6/38* (2006.01)
    *H01B 11/22* (2006.01)

(56) References Cited

U.S. PATENT DOCUMENTS

| | | |
|---|---|---|
| 4,220,812 A | 9/1980 | Ney et al. |
| 4,359,598 A | 11/1982 | Dey et al. |
| 4,365,865 A | 12/1982 | Stiles |
| 4,401,361 A | 8/1983 | Slaughter |
| 4,420,220 A | 12/1983 | Dean et al. |
| 4,467,138 A | 8/1984 | Brorein |
| 4,497,537 A | 2/1985 | Dench |
| 4,552,432 A | 11/1985 | Anderson et al. |
| 4,595,839 A | 6/1986 | Braun et al. |
| 4,695,127 A | 9/1987 | Ohlhaber et al. |
| 4,723,832 A | 2/1988 | Okazato et al. |
| 4,729,628 A | 3/1988 | Kraft et al. |
| 4,761,053 A | 8/1988 | Cogelia et al. |
| 4,787,705 A | 11/1988 | Shinmoto et al. |
| 4,844,575 A | 7/1989 | Kinard et al. |
| 4,852,965 A | 8/1989 | Mullin et al. |
| 4,867,527 A | 9/1989 | Dotti et al. |
| 4,895,426 A | 1/1990 | Pinson |
| 5,109,457 A | 4/1992 | Panuska et al. |
| 5,138,685 A | 8/1992 | Arroyo et al. |
| 5,155,304 A | 10/1992 | Gossett et al. |
| 5,268,971 A | 12/1993 | Nilsson et al. |
| 5,448,670 A | 9/1995 | Blew et al. |
| 5,469,523 A | 11/1995 | Blew et al. |
| 5,494,461 A | 2/1996 | Bippus et al. |
| 5,539,851 A | 7/1996 | Taylor et al. |
| 5,555,336 A | 9/1996 | Winslow |
| 5,555,338 A | 9/1996 | Haag et al. |
| 5,557,698 A | 9/1996 | Gareis et al. |
| 5,651,081 A | 7/1997 | Blew et al. |
| 5,677,974 A | 10/1997 | Elms et al. |
| 5,737,470 A | 4/1998 | Nagano et al. |
| 5,745,627 A | 4/1998 | Arroyo et al. |
| 5,778,116 A | 7/1998 | Tomich |
| 5,778,652 A | 7/1998 | Kunze |
| 5,838,858 A | 11/1998 | White |
| 5,896,480 A | 4/1999 | Scharf et al. |
| 5,913,003 A | 6/1999 | Arroyo et al. |
| 5,982,966 A | 11/1999 | Bonicel |
| 6,088,499 A | 7/2000 | Newton et al. |
| 6,101,305 A | 8/2000 | Wagman et al. |
| 6,142,802 A | 11/2000 | Berg et al. |
| 6,169,834 B1 | 1/2001 | Keller |
| 6,195,487 B1 | 2/2001 | Anderson et al. |
| 6,236,789 B1 | 5/2001 | Fitz |
| 6,343,172 B1 | 1/2002 | Schiestle |
| 6,347,172 B1 | 2/2002 | Keller et al. |
| 6,363,192 B1 | 3/2002 | Spooner |
| 6,370,303 B1 | 4/2002 | Fitz et al. |
| 6,463,198 B1 | 10/2002 | Coleman |
| 6,493,491 B1 | 12/2002 | Shen et al. |
| 6,501,888 B2 | 12/2002 | Gimblet et al. |
| 6,542,674 B1 | 4/2003 | Gimblet |
| 6,563,990 B1 | 5/2003 | Hurley et al. |
| 6,567,592 B1 | 5/2003 | Gimblet et al. |
| 6,599,025 B1 | 7/2003 | Deutsch |
| 6,621,964 B2 | 9/2003 | Quinn et al. |
| 6,687,437 B1 | 2/2004 | Starnes et al. |
| 6,714,710 B2 | 3/2004 | Gimblet |
| 6,719,461 B2 | 4/2004 | Cull |
| 6,738,547 B2 | 5/2004 | Spooner |
| 6,744,954 B1 | 6/2004 | Tanaka et al. |
| 6,755,575 B2 | 6/2004 | Kronlund et al. |
| 6,758,693 B2 | 7/2004 | Inagaki et al. |
| 6,792,184 B2 | 9/2004 | Conrad et al. |
| 6,836,603 B1 | 12/2004 | Bocanegra et al. |
| 6,845,200 B1 | 1/2005 | Quinn |
| 6,847,767 B2 | 1/2005 | Hurley et al. |
| 6,931,183 B2 | 8/2005 | Panak et al. |
| 6,965,718 B2 | 11/2005 | Koertel |
| 7,006,740 B1 | 2/2006 | Parris |
| 7,085,459 B2 | 8/2006 | Conrad et al. |
| 7,158,703 B2 | 1/2007 | Mjelstad |
| 7,184,634 B2 | 2/2007 | Hurley et al. |
| 7,218,821 B2 | 5/2007 | Bocanegra et al. |
| 7,225,534 B2 | 6/2007 | Kachmar |
| 7,272,281 B2 | 9/2007 | Stahulak et al. |
| 7,310,430 B1 | 12/2007 | Mallya et al. |
| 7,362,936 B2 | 4/2008 | Stark et al. |
| 7,371,014 B2 | 5/2008 | Willis et al. |
| 7,387,517 B2 | 6/2008 | Kusuda et al. |
| 7,401,985 B2 | 7/2008 | Aronson et al. |
| 7,445,389 B2 | 11/2008 | Aronson |
| 7,454,107 B2 | 11/2008 | Miller et al. |
| 7,467,896 B2 | 12/2008 | Melton et al. |
| 7,494,287 B2 | 2/2009 | Wang et al. |
| 7,499,616 B2 | 3/2009 | Aronson et al. |
| 7,532,796 B2 | 5/2009 | Chiasson |
| 7,539,380 B1 | 5/2009 | Abernathy et al. |
| 7,567,741 B2 | 7/2009 | Abernathy et al. |
| 7,643,631 B2 | 1/2010 | Kennedy |
| 7,643,713 B2 | 1/2010 | Büthe et al. |
| 7,692,098 B2 | 4/2010 | Wyatt, II et al. |
| 7,693,375 B2 | 4/2010 | Freeland et al. |
| 7,712,976 B2 | 5/2010 | Aronson et al. |
| 7,744,288 B2 | 6/2010 | Lu et al. |
| 7,762,727 B2 | 7/2010 | Aronson |
| 7,778,510 B2 | 8/2010 | Aronson et al. |
| 7,796,853 B2 | 9/2010 | Abernathy et al. |
| 7,876,989 B2 | 1/2011 | Aronson et al. |
| 7,897,873 B2 | 3/2011 | Gemme et al. |
| 7,918,609 B2 | 4/2011 | Melton et al. |
| 8,041,166 B2 | 10/2011 | Kachmar |
| 8,059,929 B2 | 11/2011 | Cody et al. |
| 8,083,417 B2 | 12/2011 | Aronson et al. |
| 8,155,525 B2 | 4/2012 | Cox |
| 8,175,433 B2 | 5/2012 | Caldwell et al. |
| 8,184,935 B2 | 5/2012 | Kachmar |
| 8,204,348 B2 | 6/2012 | Keller et al. |
| 8,224,141 B2 | 7/2012 | Kachmar et al. |
| 8,238,706 B2 | 8/2012 | Kachmar |
| 8,244,087 B2 | 8/2012 | Sales Casals et al. |
| 8,249,410 B2 | 8/2012 | Andrus et al. |
| 8,270,838 B2 | 9/2012 | Cox |
| 8,290,320 B2 | 10/2012 | Kachmar |
| 8,297,854 B2 | 10/2012 | Bickham et al. |
| 8,301,003 B2 | 10/2012 | de los Santos Campos et al. |
| 8,328,433 B2 | 12/2012 | Furuyama |
| 8,363,994 B2 | 1/2013 | Kachmar |
| 8,376,630 B2 | 2/2013 | Wang et al. |
| 8,480,312 B2 | 7/2013 | Smith et al. |
| 8,538,216 B2 | 9/2013 | Abernathy et al. |
| 8,682,124 B2 | 3/2014 | Logan |
| 8,712,200 B1 | 4/2014 | Abernathy et al. |
| 8,761,564 B2 | 6/2014 | Su et al. |
| 9,274,302 B2 | 3/2016 | Gimblet et al. |
| 9,472,314 B2 | 10/2016 | Kachmar et al. |
| 9,557,505 B2 | 1/2017 | Huegerich et al. |
| 9,837,186 B2 | 12/2017 | Kachmar et al. |
| 9,893,811 B2 | 2/2018 | Chappell et al. |
| 9,977,208 B2 | 5/2018 | Huegerich et al. |
| 10,247,893 B1* | 4/2019 | Elkayam ............ H01R 25/00 |
| 2002/0015565 A1* | 2/2002 | Imamura ............ H04B 10/806 |
| | | 385/88 |

(56) References Cited

U.S. PATENT DOCUMENTS

| | | |
|---|---|---|
| 2002/0126967 A1 | 9/2002 | Panak et al. |
| 2002/0136510 A1 | 9/2002 | Heinz et al. |
| 2002/0147978 A1 | 10/2002 | Dolgonos et al. |
| 2003/0108351 A1 | 6/2003 | Feinberg et al. |
| 2003/0202756 A1 | 10/2003 | Hurley et al. |
| 2003/0215197 A1 | 11/2003 | Simon et al. |
| 2004/0258165 A1 | 12/2004 | Peltonen |
| 2005/0002622 A1 | 1/2005 | Sutehall et al. |
| 2005/0185903 A1 | 8/2005 | Koertel |
| 2006/0045443 A1 | 3/2006 | Blazer |
| 2006/0153516 A1 | 7/2006 | Napiorkowski et al. |
| 2006/0165355 A1 | 7/2006 | Greenwood et al. |
| 2006/0246772 A1* | 11/2006 | Yamaguchi .......... G02B 6/4416 439/505 |
| 2006/0291787 A1 | 12/2006 | Seddon |
| 2007/0248358 A1 | 10/2007 | Sauer |
| 2007/0269170 A1 | 11/2007 | Easton et al. |
| 2008/0037941 A1 | 2/2008 | Mallya |
| 2008/0131132 A1 | 6/2008 | Solheid et al. |
| 2008/0219621 A1 | 9/2008 | Aldeghi et al. |
| 2008/0260389 A1 | 10/2008 | Zheng |
| 2009/0041413 A1 | 2/2009 | Hurley |
| 2009/0297104 A1 | 12/2009 | Kachmar |
| 2010/0080563 A1 | 4/2010 | DiFonzo et al. |
| 2010/0150556 A1 | 7/2010 | Soto et al. |
| 2010/0200270 A1 | 8/2010 | Gemme et al. |
| 2010/0209058 A1 | 8/2010 | Ott |
| 2010/0290787 A1 | 11/2010 | Cox |
| 2010/0321591 A1 | 12/2010 | Onomatsu |
| 2011/0021069 A1 | 1/2011 | Hu et al. |
| 2011/0038582 A1 | 2/2011 | DiFonzo et al. |
| 2011/0091174 A1 | 4/2011 | Kachmar |
| 2011/0150401 A1 | 6/2011 | Furuyama |
| 2011/0188815 A1 | 8/2011 | Blackwell, Jr. et al. |
| 2011/0217010 A1 | 9/2011 | Kachmar |
| 2011/0268446 A1 | 11/2011 | Cune et al. |
| 2011/0268452 A1 | 11/2011 | Beamon et al. |
| 2011/0280527 A1 | 11/2011 | Tamura |
| 2011/0293227 A1 | 12/2011 | Wu |
| 2011/0311191 A1 | 12/2011 | Hayashishita et al. |
| 2012/0008904 A1 | 1/2012 | Han et al. |
| 2012/0008905 A1 | 1/2012 | Han et al. |
| 2012/0008906 A1 | 1/2012 | Han et al. |
| 2012/0057821 A1 | 3/2012 | Aronson et al. |
| 2012/0080225 A1 | 4/2012 | Kim et al. |
| 2012/0114288 A1 | 5/2012 | Wu |
| 2012/0141064 A1 | 6/2012 | Walker |
| 2012/0191997 A1 | 7/2012 | Miller |
| 2012/0230637 A1 | 9/2012 | Kachmar |
| 2012/0281952 A1 | 11/2012 | McColloch |
| 2012/0281953 A1 | 11/2012 | Choi et al. |
| 2012/0288245 A1 | 11/2012 | Hurley et al. |
| 2012/0295486 A1 | 11/2012 | Petersen et al. |
| 2012/0315004 A1 | 12/2012 | Register, III et al. |
| 2013/0011106 A1 | 1/2013 | Congdon, II et al. |
| 2013/0022318 A1 | 1/2013 | Fingler et al. |
| 2013/0058613 A1 | 3/2013 | Jost et al. |
| 2013/0094821 A1 | 4/2013 | Logan |
| 2013/0094823 A1 | 4/2013 | Gimblet et al. |
| 2013/0287349 A1 | 10/2013 | Faulkner et al. |
| 2013/0330086 A1 | 12/2013 | Berlin et al. |
| 2014/0016527 A1* | 1/2014 | Coffey ................. H04B 5/0062 370/310 |
| 2014/0072264 A1 | 3/2014 | Schroder et al. |
| 2014/0087742 A1 | 3/2014 | Brower et al. |
| 2014/0258742 A1 | 9/2014 | Chien et al. |
| 2014/0314412 A1 | 10/2014 | Soto |
| 2014/0338968 A1 | 11/2014 | Kachmar et al. |
| 2015/0125146 A1 | 5/2015 | Erreygers et al. |
| 2015/0309271 A1 | 10/2015 | Huegerich et al. |
| 2015/0378118 A1 | 12/2015 | Huegerich et al. |
| 2016/0020911 A1 | 1/2016 | Sipes, Jr. et al. |
| 2016/0294475 A1 | 10/2016 | Chappell et al. |
| 2016/0300643 A1 | 10/2016 | Kachmar et al. |
| 2017/0184799 A1 | 6/2017 | Huegerich et al. |
| 2018/0061529 A1 | 3/2018 | Kachmar et al. |

FOREIGN PATENT DOCUMENTS

| | | |
|---|---|---|
| AU | 2010235866 A1 | 11/2010 |
| CN | 101449189 A | 6/2009 |
| CN | 201359882 Y | 12/2009 |
| CN | 101925841 A | 12/2010 |
| CN | 201868149 U | 6/2011 |
| CN | 102136649 A | 7/2011 |
| CN | 102263340 A | 11/2011 |
| CN | 102934377 A | 2/2013 |
| EP | 0 629 889 A1 | 12/1994 |
| EP | 1 650 888 A1 | 4/2006 |
| EP | 2 393 220 A1 | 12/2011 |
| EP | 2 393 222 A1 | 12/2011 |
| EP | 2 676 161 | 12/2013 |
| KR | 10-1997-0060748 A | 8/1997 |
| KR | 20-0273482 Y1 | 4/2002 |
| WO | 2010/102201 A2 | 9/2010 |
| WO | 2011/146720 A2 | 11/2011 |
| WO | 2012/112532 A2 | 8/2012 |
| WO | 2013/117598 A2 | 8/2013 |

OTHER PUBLICATIONS

European Search Report for Application No. 14797917.3 dated Dec. 6, 2016.
Extended European Search Report for Application No. 14825675.3 dated Jan. 30, 2017.
Extended European Search Report for Application No. 14751600.9 dated Mar. 22, 2017.
"GE—Critical Power, DAS and Small Cell Powering Architectures," DAS and Small Cell Congress, May 1, 2013; 22 pages.
IEC 60603-7-7, Second Edition Jun. 2006, "Connectors for electronic equipment", Part 7-7.
International Search Report and Written Opinion for PCT/US2014/015969 dated Jul. 21, 2014.
International Search Report and Written Opinion for PCT/US2014/000115 dated Sep. 24, 2014.
International Search Report and Written Opinion for PCT/US2014/046678 dated Nov. 6, 2014.
International Search Report and Written Opinion for PCT/US2014/030969 dated Nov. 26, 2014.
Littelfuse Inc., "Transient Suppression Devices and Principles" application note AN9768, dated Jan. 1998. Retrieved from http://www.littelfuse.com/~/media/electronics_technical/application_notes/varistors/littelfuse_transient_suppression_devices_and_principles_application_note.pdf.
OneReach PoE Extender System brochure from Berk-Tek, 8 pages (Jan. 2011).
Silvertel, "Ag5700 200W Powered Device Module" datasheet, dated Aug. 2012. Retrieved from http://www.silvertel.com/images/datasheets/Ag5700-datasheet-200W-Power-over-Ethernet-PoE-PD.pdf.
Extended European Search Report for Application No. 21168354.5 dated Aug. 23, 2021.

* cited by examiner

POWER AND OPTICAL FIBER INTERFACE

CROSS-REFERENCE TO RELATED APPLICATIONS

This application is a continuation application of U.S. Non-Provisional patent application Ser. No. 15/985,068, filed May 21, 2018, now U.S. Pat. No. 10,502,912 which is a continuation of U.S. Non-Provisional patent application Ser. No. 15/373,709, filed Dec. 9, 2016, now U.S. Pat. No. 9,977,208, issued May 22, 2018, which is a continuation application of U.S. Non-Provisional patent application Ser. No. 14/331,873, filed Jul. 15, 2014, now U.S. Pat. No. 9,557,505, issued Jan. 31, 2017, which claims the benefit of U.S. Provisional Patent Application Ser. No. 61/846,392, filed Jul. 15, 2013 and is a continuation-in-part of PCT Patent Application No. PCT/US2014/030969, filed Mar. 18, 2014, which claims the benefit of U.S. Provisional Patent Application Ser. No. 61/802,989, filed Mar. 18, 2013. The disclosures of all of the above-mentioned patent applications are hereby incorporated by reference in their entireties.

BACKGROUND

The present disclosure relates generally to hybrid optical fiber and electrical communication systems.

Rapid growth of portable high-speed wireless transceiver devices (e.g., smart phones, tablets, laptop computers, etc.) continues in today's market, thereby creating higher demand for untethered contact. Thus, there is growing demand for integrated voice, data and video capable of being transmitted wirelessly at data rates of 10 Gbits/second and faster. To provide the bandwidth needed to support this demand will require the cost effective and efficient deployment of additional fixed location transceivers (i.e., cell sites or nodes) for generating both large and small wireless coverage areas. Fiber optic technology is becoming more prevalent as service providers strive to deliver higher bandwidth communication capabilities to customers/subscribers. The phrase "fiber to the x" (FTTX) generically refers to any network architecture that uses optical fiber in place of copper within a local distribution area. Example FTTX networks include fiber-to-the-node (FTTN) networks, fiber-to-the-curb (FTTC) networks, fiber-to-the-home (FTTH), and more generally, fiber-to-the-wireless (FTTW).

SUMMARY

In accordance with aspects of the present disclosure, examples of a power and optical fiber interface system include a housing having an interior. A cable inlet is configured to receive a hybrid cable having an electrical conductor and an optical fiber. An insulation displacement connector (IDC) is situated in the interior of the housing configured to electrically terminate the conductor, and a cable outlet is configured to receive an output cable that is connectable to the IDC and configured to output signals received via the optical fiber.

In accordance with further aspects of the disclosure, examples of the disclosed system include a power converter, such as a DC-DC converter electrically connected to the IDC. An optical fiber management device, such as an optical splice device, is situated in the interior of the housing and configured to receive the optical fiber. A media board is included in some embodiments that is configured to convert optical signals to electrical signals. In some implementations, the IDC includes a housing with a fiber pass-through groove configured to route optical fibers through the housing of the IDC, and first and second conductor grooves are situated on either side of the fiber pass-through groove to receive first and second conductors.

Another aspect of the present disclosure relates to a powered fiber optic system. The powered fiber optic system includes a first location including a power source and fiber optic network access and a plurality of active devices remotely positioned with respect to the first location. The powered fiber optic system further includes a plurality of hybrid cables routed from the first location toward the active devices. The hybrid cables include optical fibers for transmitting optical signals and electrical conductors for carrying power. The powered fiber optic system further includes interface devices mounted adjacent to the active devices for providing interfaces between the hybrid cables and the active devices. The interface devices include electrical power management circuitry positioned within the closure for providing DC-to-DC voltage conversion within the closure and also include circuit protection circuitry for providing current surge protection.

A further aspect of the present disclosure relates to an interface device for providing an interface between a hybrid cable and an active device. The interface device includes a closure adapted for outside environmental use and a cable anchoring structure for securing a hybrid cable to the closure. The hybrid cable is configured to carry both electrical power and optical signals. The interface device also includes electrical power management circuitry positioned within the closure for providing DC-to-DC voltage conversion within the closure. The electrical power management circuitry is customizable to output one of a plurality of different DC voltage levels such that the DC output level can be matched with a power requirement of the active device. The interface device also includes electrical protection circuitry positioned within the closure and an output configuration for outputting power and communications signals from the interface device to the active device. The output configuration has a format that is customizable and selectable from a plurality of formats that include all of the following formats: a) a power over Ethernet format or a power over Ethernet plus format; and b) a format including one or more optical fibers for the optical signals and separate electrical conductors for power.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as top, bottom, front, back, etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense.

Figure 1:
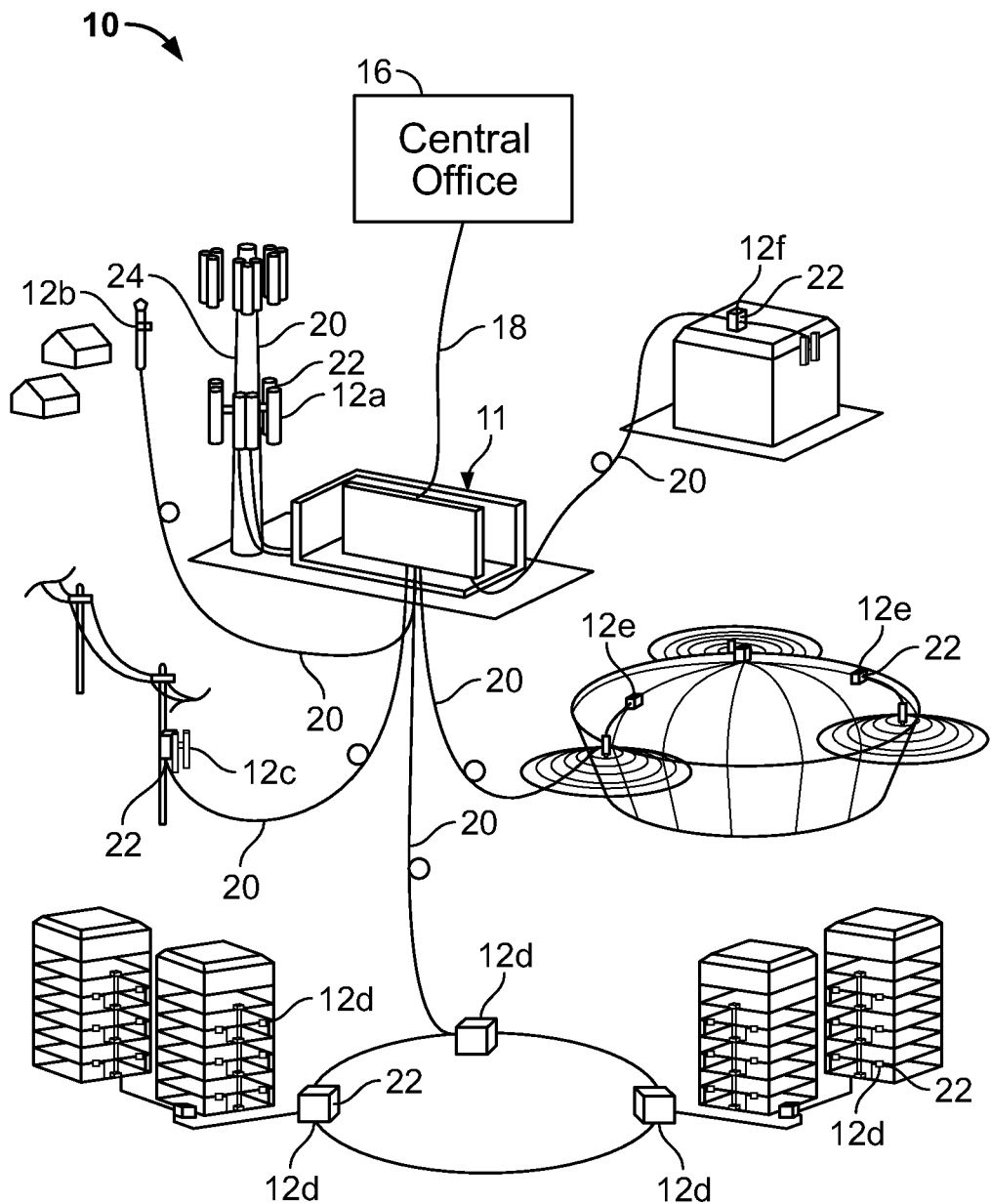
FIG. 1 is a system diagram showing an example distribution of wireless coverage areas deployed using a power and optical fiber interface system in accordance with principles of the present disclosure.

FIG. 1 shows a system 10 in accordance with the principles of the present disclosure for enhancing the coverage areas provided by cellular technologies (e.g., GSM, CDMA, UMTS, LTE, WiMax, WiFi, etc.). The system 10 includes a base location 11 (i.e., a hub) and a plurality of wireless coverage area defining equipment 12a, 12b, 12c, 12d, 12e and 12f (sometimes collectively referred to as equipment 12 herein) distributed about the base location 11. In certain examples, the base location 11 can include a structure 14 (e.g., a closet, hut, building, housing, enclosure, cabinet, etc.) protecting telecommunications equipment such as racks, fiber optic adapter panels, passive optical splitters, wavelength division multiplexers, fiber splice locations, optical fiber patching and/or fiber interconnect structures and other active and/or passive equipment. In the depicted example, the base location 11 is connected to a central office 16 or other remote location by a fiber optic cable such as a multi-fiber optical trunk cable 18 that provides high bandwidth two-way optical communication between the base location 11 and the central office 16 or other remote location. In the depicted example, the base location 11 is connected to the wireless coverage area defining equipment 12a, 12b, 12c, 12d, 12e and 12f by hybrid cables 20. The hybrid cables 20 are each capable of transmitting both power and communications between the base location 11 and the wireless coverage area defining equipment 12a, 12b, 12c, 12d, 12e and 12f.

The wireless coverage area defining equipment 12a, 12b, 12c, 12d, 12e and 12f can each include one or more wireless transceivers 22. The transceivers 22 can include single transceivers 22 or distributed arrays of transceivers 22. As used herein, a "wireless transceiver" is a device or arrangement of devices capable of transmitting and receiving wireless signals. A wireless transceiver typically includes an antenna for enhancing receiving and transmitting the wireless signals. Wireless coverage areas are defined around each of the wireless coverage area defining equipment 12a, 12b, 12c, 12d, 12e and 12f. Wireless coverage areas can also be referred to as cells, cellular coverage areas, wireless coverage zones, or like terms. Examples of and/or alternative terms for wireless transceivers include radio-heads, wireless routers, cell sites, wireless nodes, etc.

In the depicted example of FIG. 1, the base location 11 is shown as a base transceiver station (BTS) located adjacent to a radio tower 24 supporting and elevating a plurality the wireless coverage area defining equipment 12a. In one example, the equipment 12a can define wireless coverage areas such as a macrocells or microcells (i.e., cells each having a coverage area less than or equal to about 2 kilometers wide). The wireless coverage area defining equipment 12b is shown deployed at a suburban environment (e.g., on a light pole in a residential neighborhood) and the equipment 12c is shown deployed at a roadside area (e.g., on a roadside power pole). The equipment 12c could also be installed at other locations such as tunnels, canyons, coastal areas, etc. In one example, the equipment 12b, 12c can define wireless coverage areas such as microcells or picocells (i.e., cells each having a coverage area equal to or less than about 200 meters wide). The equipment 12d is shown deployed at a campus location (e.g., a university or corporate campus), the equipment 12e is shown deployed at a large public venue location (e.g., a stadium), and the equipment 12f is shown installed at an in-building or near-building environment (e.g., multi-dwelling unit, high rise, school, etc.). In one example, the equipment 12d, 12e, and 12f can define wireless coverage areas such as microcells, picocells, or femtocells (i.e., cells each having a coverage area equal to or less than about 10 meters wide).

Figure 2:
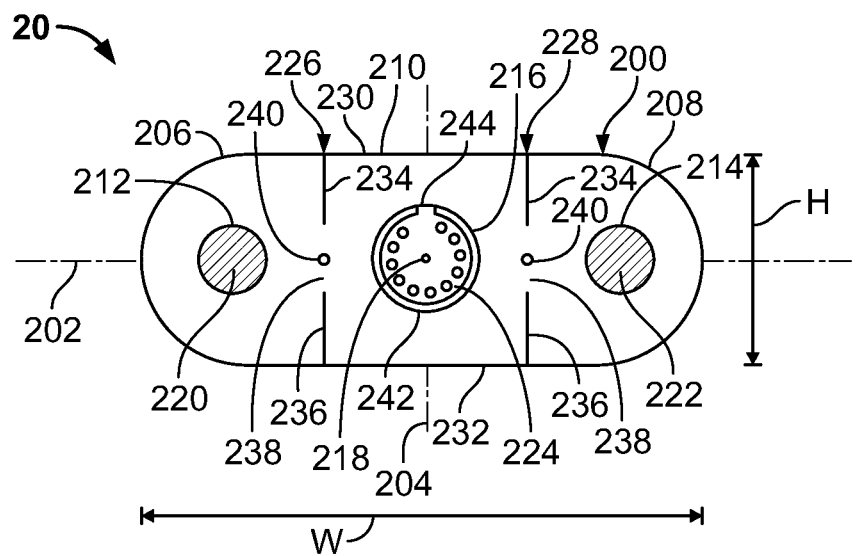
FIG. 2 is a transverse cross-sectional view of a power/optical fiber hybrid cable in accordance with principles of the present disclosure.

The wireless coverage area defining equipment 12 are often located in areas without power outlets conveniently located. As noted above, the hybrid cable 20 provides both power and data to the equipment 12. FIG. 2 is a transverse cross-sectional view taken through an example of one of the hybrid cables 20 of FIG. 1. Hybrid cable 20 includes an outer jacket 200 having a transverse cross-sectional profile that defines a major axis 202 and a minor axis 204. The outer jacket has a height H measured along the minor axis 204 and a width W measured along the major axis 202. The width W is greater than the height H such that the transverse cross-sectional profile of the outer jacket 200 is elongated along the major axis 202.

The outer jacket 200 can include a left portion 206, a right portion 208 and a central portion 210. The left portion 206, the right portion 208 and the central portion 210 can be positioned along the major axis 202 with the central portion 210 being disposed between the left portion 206 and the right portion 208. The left portion 206 can define a left passage 212, the right portion 208 can define a right passage 214 and the central portion 210 can define a central passage 216. The passages 212, 214 and 216 can have lengths that extend along a central longitudinal axis 218 of the cable 20 for the length of the cable. A left electrical conductor 220 is shown positioned within the left passage 212, a right electrical conductor 222 is shown positioned within the right passage 214 and at least one optical fiber 224 is shown positioned within the central passage 216. Certain embodiments include from 1 to 12 fibers 224, for example. The left electrical conductor 220, the right electrical conductor 222 and the optical fiber 224 have lengths that extend along the central longitudinal axis 218 of the cable 20.

Still referring to FIG. 2, the hybrid cable 20 includes a left pre-defined tear location 226 positioned between the central portion 210 and the left portion 206 of the outer jacket 200, and a right pre-defined tear location 228 positioned between the central portion 210 and the right portion 208 of the outer jacket 200. The left pre-defined tear location 226 is weakened such that the left portion 206 of the outer jacket 200 can be manually torn from the central portion 210 of the outer jacket 200. Similarly, the right pre-defined tear location 228 is weakened such that the right portion 208 of the outer jacket 200 can be manually torn from the central portion 210 of the outer jacket 200. The left pre-defined tear location 226 is configured such that the left portion 206 of the outer jacket 200 fully surrounds the left passage 212 and the central portion 210 of the outer jacket 200 fully surrounds the central passage 216 after the left portion 206 of the outer jacket 200 has been torn from the central portion 210 of the outer jacket 200. In this way, the left electrical conductor 220 remains fully insulated and the optical fiber 220 remains fully protected after the left portion 206 has been torn from the central portion 210. The right pre-defined tear location 228 is configured such that the right portion 208 of the outer jacket 200 fully surrounds the right passage 214 and the central portion 210 of the outer jacket 200 fully surrounds the central passage 219 after the right portion 208 of the outer jacket 200 has been torn from the central portion 210 of the outer jacket 200. In this way, the right electrical conductor 222 remains fully insulated and the optical fiber 224 remains fully protected after the right portion 208 has been torn from the central portion 210.

Figures 3, 4:
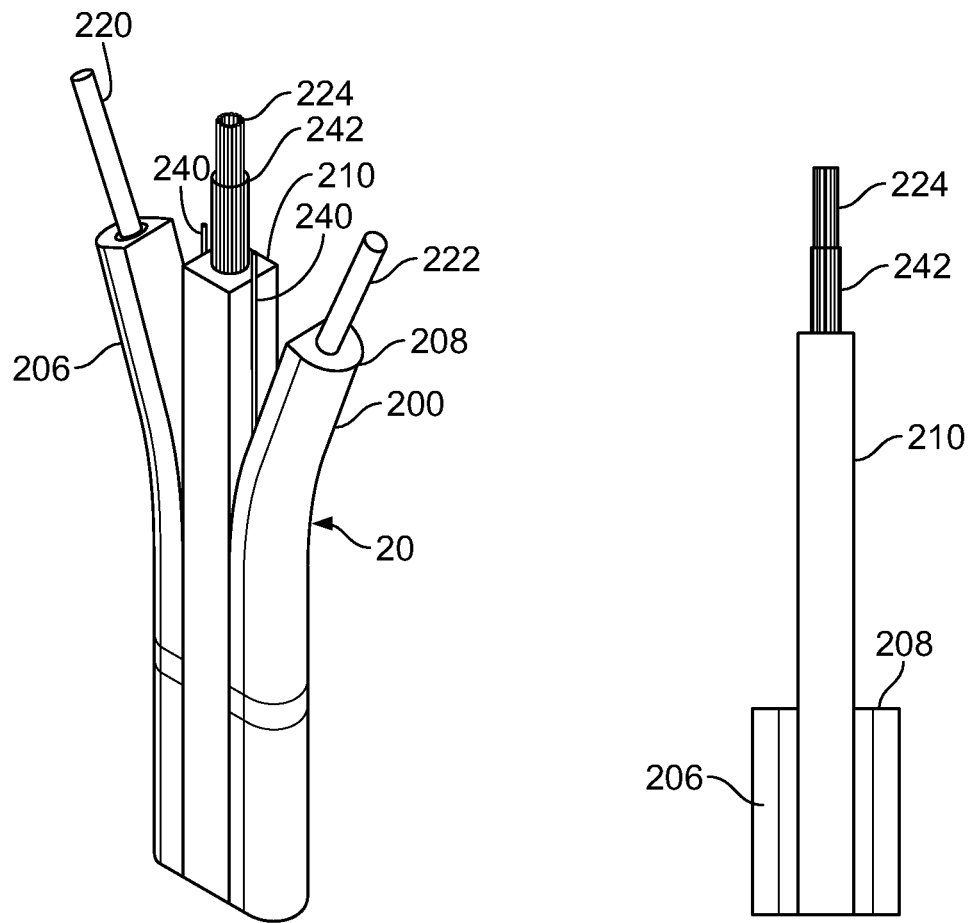
FIG. 3 is a perspective view of a portion of the hybrid cable of FIG. 2 with electrically conductive portions of the cable showing separated from a central optical fiber portion of the cable.
FIG. 4 is a plan view of the hybrid cable of FIGS. 2 and 3 with the electrically conductive portions of the hybrid cable trimmed relative to the central fiber optic portion of the hybrid cable.

FIG. 3 shows the hybrid cable 20 with both the left portion 206 and the right portion 208 torn away from the central portion 210. In this configuration, both the left electrical conductor 220 and the right electrical conductor 222 are fully insulated by their corresponding left and right portions 206, 208. Additionally, the central portion 210 has a rectangular transverse cross-sectional shape that fully surrounds the central passage 216 so as to protect the optical fiber or fibers 224.

It will be appreciated that the left and right electrical conductors 220, 222 have a construction suitable for carrying electricity. It will be appreciated that the electrical conductors can have a solid or stranded construction. Example sizes of the electrical conductors include 12 gauge, 16 gauge, or other sizes.

The outer jacket 200 is preferably constructed of a polymeric material. In one example, the hybrid cable 20 and the outer jacket 200 are plenum rated. In certain examples, the outer jacket 200 can be manufactured of a fire-retardant plastic material. In certain examples, the outer jacket 200 can be manufactured of a low smoke zero halogen material. Example materials for the outer jacket include polyvinyl chloride (PVC), fluorinated ethylene polymer (FEP), polyolefin formulations including, for example, polyethylene, and other materials.

The central passage 216 can contain one or more optical fibers 224. In certain examples, the optical fibers 224 can be coated optical fibers having cores less than 12 microns in diameter, cladding layers less than 240 microns in diameter, and coating layers less than 300 microns in diameter. It will be appreciated that the core and cladding layers typically include a silica based material. In certain examples, the cladding layer can have an index of a refraction that is less than the index of refraction of the core to allow optical signals that are transmitted through the optical fibers to be confined generally to the core. It will be appreciated that in certain examples, multiple cladding layers can be provided. In certain examples, optical fibers can include bend insensitive optical fibers having multiple cladding layers separated by trench layers. In certain examples, protective coatings (e.g., a polymeric material such as actelate) can form coating layers around the cladding layers. In certain examples, the coating layers can have diameters less than 300 microns, or less than 260 microns, or in the range of 240 to 260 microns. In certain examples, the optical fibers 224 can be unbuffered. In other examples, the optical fibers can include a tight buffer layer, a loose buffer layer, or a semi-tight buffer layer. In certain examples, the buffer layers can have an outer diameter of about 800 to 1,000 microns. The optical fibers can include single mode optical fibers, multi-mode optical fibers, bend insensitive fibers or other fibers. In still other embodiments, the optical fibers 224 can be ribbonized.

As shown at FIG. 4, the left and right portions 206, 208 can be trimmed relative to the central portion 210 after the left and right portions 206, 204 have been torn away from the central portion 210. In this configuration, the central portion 210 extends distally beyond the ends of the left and right portions 206, 208. In certain examples, insulation displacement connectors can be used to pierce through the jacket materials of the left and right portions 206, 208 to electrically connect the left and right electrical connectors 220, 222 to an electrical power source, ground, active components or other structures. It will be appreciated that the optical fibers 224 can be connected to other fibers with mechanical or fusion splices, or directly terminated with optical connectors. In other examples, connectorized pigtails can be spliced to the ends of the optical fibers 224.

Referring back to FIG. 2, the outer jacket 200 includes a top side 230 and a bottom side 232 separated by the height H. As depicted, the top and bottom sides 230, 232 are generally parallel to one another. Each of the left and right pre-defined tear locations 226, 228 includes an upper slit 234 that extends downwardly from the top side 230, a lower slit 236 that extends upwardly from the bottom side 232 and a non-slitted portion 238 positioned between the upper and lower slits 234, 236. In one example embodiment, the upper and lower slits 234, 236 are partially re-closed slits. In the depicted embodiment, the left and right pre-defined tear locations 226, 228 also include jacket weakening members 240 that are imbedded in the non-slitted portions 238. By way of example, the jacket weakening members 240 can include strands, monofilaments, threads, filaments or other members. In certain examples, the jacket weakening members 240 extend along the central longitudinal axis 218 of the cable 20 for the length of the cable 20. In certain examples, the jacket weakening members 240 are aligned along the major axis 202. In certain examples, the upper and lower slits 230, 236 as well as the jacket weakening member 240 of the left pre-defined tear location 226 are aligned along a left tearing plane PL that is oriented generally perpendicular relative to the major axis 202. Similarly, the upper and lower slits 234, 236 as well as the jacket weakening member 240 of the right pre-defined tear location 228 are aligned along a right tearing plane PR that is oriented generally perpendicular with respect to the major axis 202.

Referring again to FIG. 2, the hybrid cable 20 can include a tensile strength structure 242 that provides tensile enforcement to the hybrid cable 20 so as to prevent tensile loads from being applied to the optical fibers 224. In certain embodiments, the tensile strength structure 242 can include reinforcing structures such as Aramid yarns or other reinforcing fibers. In still other embodiments, the tensile strength structure 242 can have an oriented polymeric construction. In still other examples, a tensile strength structure 242 can include a reinforcing tape. In certain examples, the reinforcing tape can be bonded to the outer jacket 200 so as to line the central passage 216. In certain examples, no central buffer tube is provided between the optical fibers 224 and the tensile reinforcing structure 242. In certain examples, the tensile strength structure 242 can include a reinforcing tape that extends along the length of the hybrid cable 20 and has longitudinal edges/ends 244 that are separated so as to define a gap 244 therein between. In use, the tensile strength member 242 can be anchored to a structure such as a fiber optic connector, housing or other structure so as to limit the transfer of tensile load to the optical fibers 224. It will be appreciated that the tensile strength structure 242 can be anchored by techniques such as crimping, adhesives, fasteners, bands or other structures.

Figure 5:
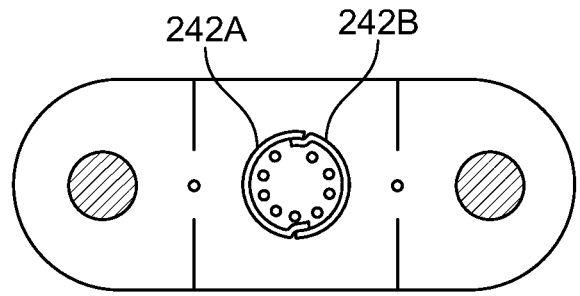
FIG. 5 is a transverse cross-sectional view of another power/optical fiber hybrid cable in accordance with principles of the present disclosure.

FIG. 5 shows an alternative hybrid cable 20' having the same construction as the hybrid cable 20 except two tensile strength structures 242A, 242B have been provided within the central passage 216. Tensile strength members 242A, 242B each include a tensile reinforcing tape that is bonded to the central portion 210 of the outer jacket 200. The tensile strength members 242A, 242B can include portions that circumferentially overlap one another within the central passage 216. In certain examples, by stripping away an end portion of the central portion 210, the tensile strength structures 242A, 242B can be exposed and readily secured to a structure such as a fiber optic connector, a panel, a housing or other structure. In one example, the tensile strength structures 242A, 242B can be crimped, adhesively secured or otherwise attached to rods (e.g., epoxy rods reinforced with fibers) that are in turn secured within a ruggedized fiber optic connector such as the fiber optic connector disclosed at U.S. Pat. No. 7,744,288 which is hereby incorporated by reference in its entirety, or the fiber optic connector disclosed at U.S. Pat. No. 7,918,609, which is hereby incorporated by reference in its entirety.

As noted above, the electrical conductors 220, 222 could be 12 gauge (AWG) or 16 gauge, for example. In certain examples, a 12 gauge conductor 220, 220 provides up to 1175 meter reach at 15 W, and a 750 meter reach for 25 W devices. The 16 gauge implementations can provide reduced cost for shorter reach applications or lower power devices, for example.

Figure 6:
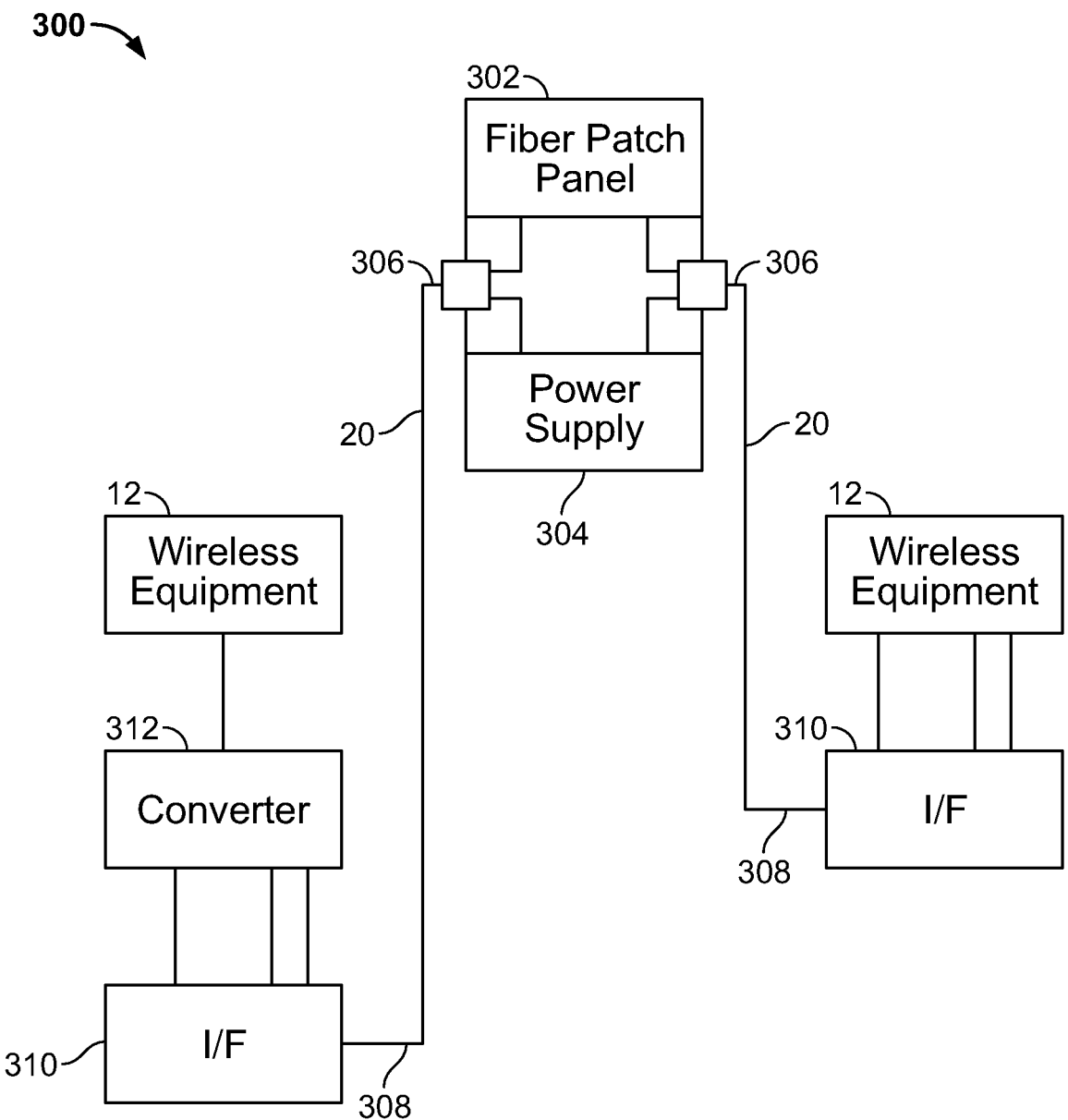
FIG. 6 is a block diagram conceptually illustrating aspects of a communication and power distribution system in accordance with principles of the present disclosure.
Figure 7:
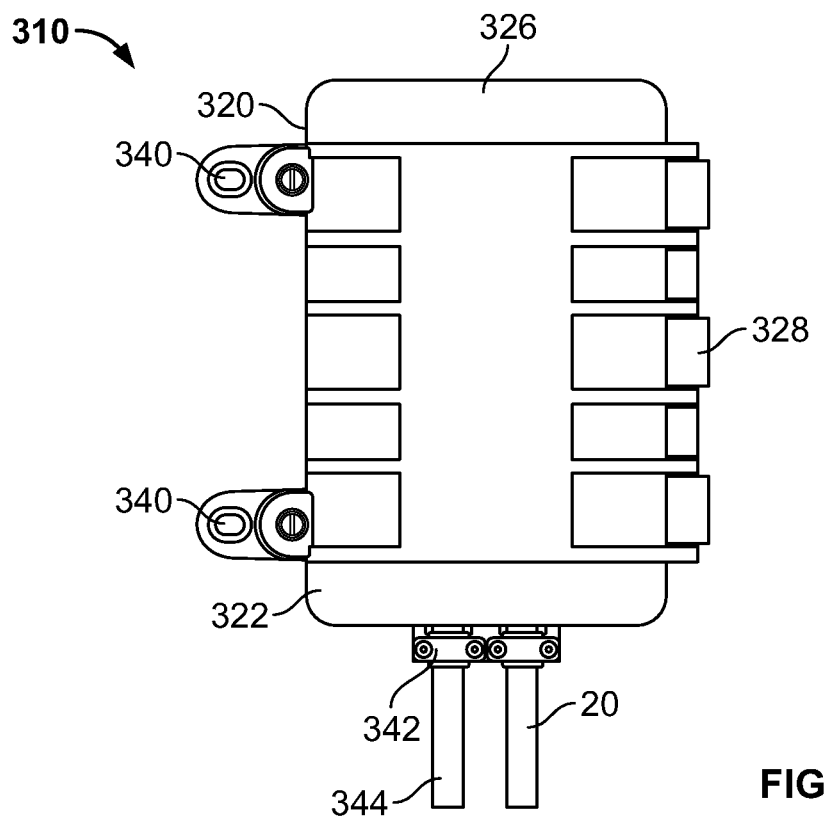
FIG. 7 is a top view of an interface device in accordance with principles of the present disclosure.
Figure 8:
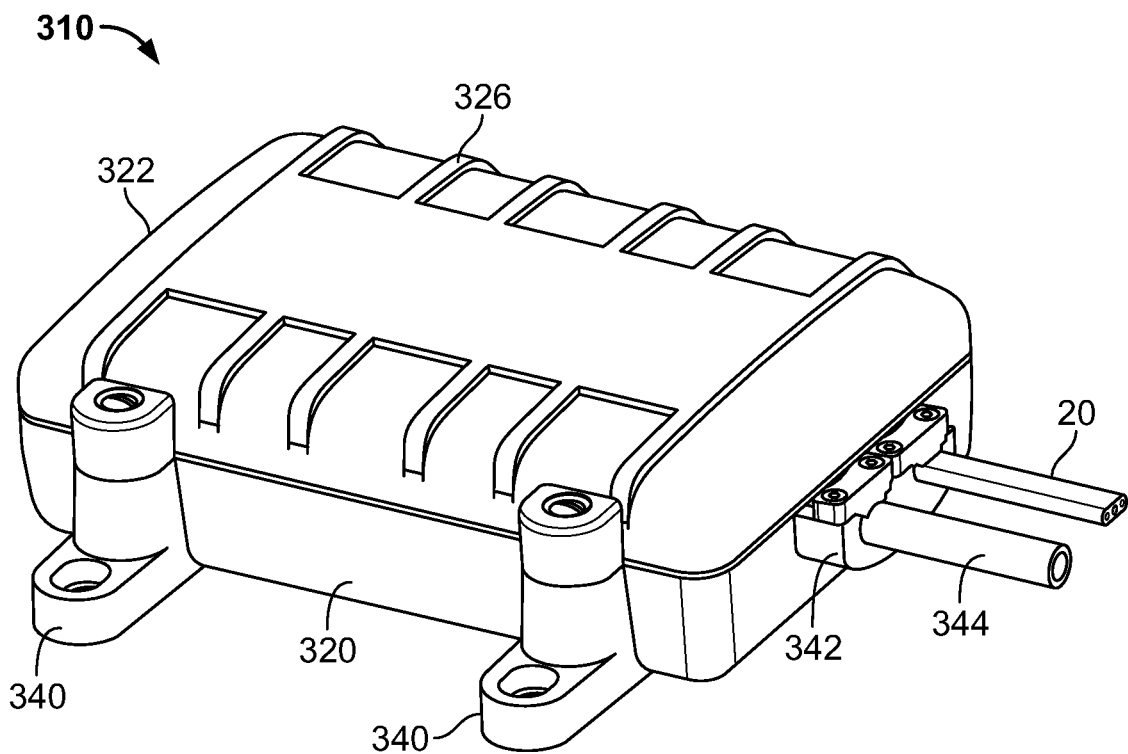
FIG. 8 is a perspective view of the interface device shown in FIG. 7.

Providing power to remote active devices such as the wireless coverage area defining equipment 12 is often difficult and expensive. Providing required power protection and backup power further complicates powering such remote devices. Optical Network Terminals (ONT's) and Small Cell devices (such as picocells and metrocells) have "similar" power requirements. For example, 25 W, 12 VDC or 48 VDC devices are common, although variations occur. FIG. 6 conceptually illustrates an example of a communication signal and power distribution system 300 in accordance with aspects of the present disclosure. Among other things, the system 300 provides a simple, "universal" connection of the optical fiber 224 and electrical conductors 220,222 of the hybrid cable 20 to the equipment 12.

The system 300 includes a fiber patch panel 302 that terminates optical fibers carrying signals to be distributed to the desired wireless coverage area defining equipment 12 via the optical fibers 224 of the hybrid cables 20. A power supply 304 connects to the conductors 220, 222 of the desired hybrid cable 20. In some examples, the power supply 304 receives 120/220 VAC and provides 48 VDC nominal. In some embodiments, the fiber patch panel 302 and power supply 304 are rack mounted.

A first end 306 of the hybrid cable 20 is connected to the appropriate optical fibers from the fiber patch panel 302 and to the power supply 304. A second, distant end 308 of the cable 20 is connected to an interface device 310. The interface device is connected to the wireless equipment 12, either directly or through a media converter 312. Examples of the interface 310 provide simplified termination of the hybrid cable 20, allowing factory or field installation. In some embodiments, a DC-DC converter provides the desired voltage level for the particular device 12 to which it is connected and compensates for IR loss across variable link lengths.

FIGS. 7-13 illustrate various views of embodiments of the interface device 310. The interface device 310 includes a body 320 having an exterior 322 and an interior 324. A cover 326 is connected to the body 320 by a hinge 328 such that the interface device 310 can be opened to expose the interior 324 for access by an operator. A mounting bracket 340 extends from the body 320 for mounting the interface device 310 as desired using screws or bolts, for example. In one example, the interface device 310 defines footprint dimensions of about 55 mm×125 mm×190 mm.

A cable clamp 342 cooperates with the body 320 to fix the hybrid input cable 20 and an output cable 344 to the interface device 310 at a cable inlet 350 and a cable outlet 352, respectively. As noted above, the hybrid cable 20 includes electrical conductors 220, 220 for supplying power to the interface device 310, and ultimately the remote device 12. In the illustrated examples, the interface device 310 includes an insulation displacement connector (IDC) 360 situated in the interior 324 of the interface device body 320 for connecting the conductors 220, 220 to the interface device 310. Generally, an IDC (also sometimes referred to as insulation displacement termination and insulation piercing connector) is an electrical connector that connects to one or more conductors of an insulated conductor by a connection process that forces a selectively sharpened blade or blades through the insulation to contact the conductor, eliminating the need to strip the insulation before connecting. Further, the connector blades cold weld to the conductors to form a gas-tight connection.

Figure 9:
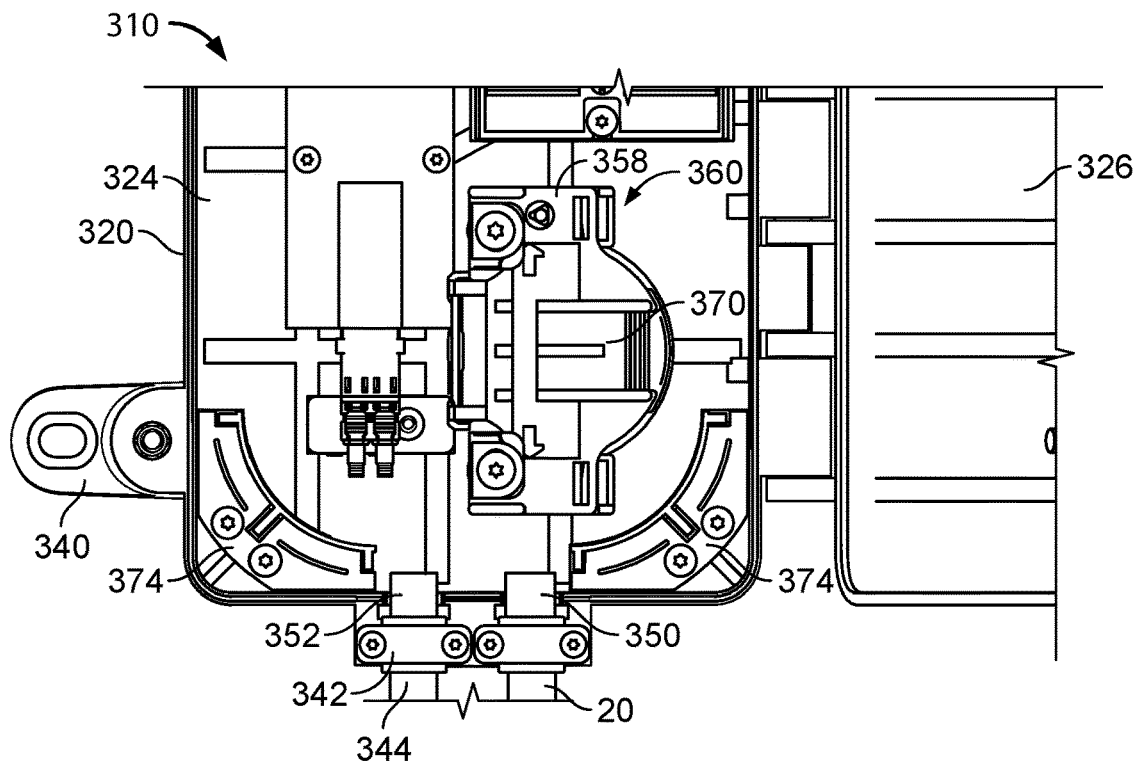
FIG. 9 is a partial top view of the interface device shown in FIG. 7, illustrating aspects of an insulation displacement connector (IDC) in an open position.
Figure 10:
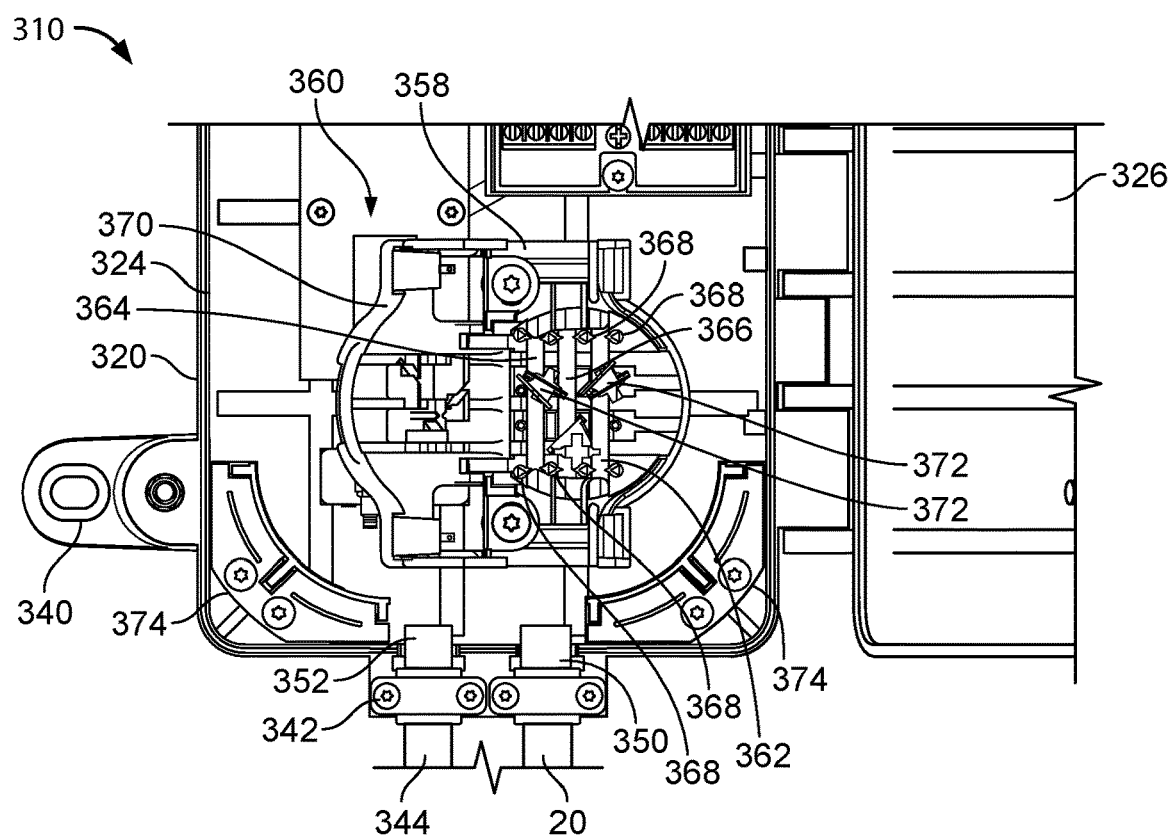
FIG. 10 is another partial top view of the interface device shown in FIG. 7, illustrating aspects of the IDC in a closed position.

FIGS. 9 and 10 illustrate the IDC 360 in closed and open positions, respectively. As shown in FIG. 3 and discussed in conjunction therewith above, the hybrid cable 20 is configured such that the left portion 206 and the right portion 208 can be torn away from the central portion 210. In this configuration, both the left electrical conductor 220 and the right electrical conductor 222 are fully insulated by their corresponding left and right portions 206, 208. Referring to FIG. 10, the IDC 360 includes a housing 358 with first and second conductor grooves 362, 364 positioned on either side of a fiber pass-through groove 366. Correspondingly, the electrical conductors 220, 222 of the hybrid cable 20 are situated on either side of the central portion 210 containing the optical fibers 224.

The conductors 220, 222 are received by the corresponding conductor grooves 362, 364, and insulator clamping ribs 368 are situated to press against the jacket 200 to hold the hybrid cable 20 in place. The IDC 360 includes a cover 370 hingedly connected to the housing 358 that when closed presses IDC terminals 372 against the conductors 220, 222 and through the left portion 206 and the right portion 208 of the outer jacket 200 to make an electrical connection with the conductors 220, 222. The illustrated IDC terminals 372 are angled to provide a gas-tight connection. In the illustrated example, the left and right portions 206, 208 are trimmed such that the conductors 220,222 extend beyond the IDC terminals 372 but remain within the housing 358 of the IDC 360.

In other embodiments, the IDC is configured in a "pass-through" power arrangement, wherein the terminals 372 pierce the left and right portions 206, 208 to contact the conductors 220,222, but the left and right portions 206, 208 are not trimmed so they extend through the IDC 360 to be routed to equipment 12 or another interface device 310, such as via the cable outlet 352.

In the illustrated example, a power converter 376, such as a DC-DC voltage converter, is situated in the interior 324 of the base 320 and electrically connected to the IDC 360 so as to electrically connect the conductors 220, 220 of the hybrid cable 20 to the power converter 376 via the IDC 360. Thus, power entering the interface device 310 via the hybrid cable 20 can be conditioned and/or converted to the desired level for the wireless coverage area defining equipment 12 to which the interface device 310 connects. The power converter 376 is connectable to the output cable 344 to route the conditioned/converted power from the interface device 310 to the desired wireless equipment 12. For instance, conductors of the output cable 344 could connect directly to the power converter 376 using screw terminals 378 thereon. In alternative embodiments, the power converter 376 can be omitted or bypassed if the power received by the interface device 310 is appropriate for the particular end device 12. Further power connection arrangements are discussed herein below.

The optical fibers 224 from the hybrid cable 20 are received by the centrally positioned fiber pass-through groove 366 to route the optical fibers 224 through the housing 358 of the IDC 360. The fibers 224 extend from the housing 358 and are routed along the perimeter of the interior 324 of the interface device 310. In some embodiments, the optical fibers 324 are routed through the interior 324 directly to the cable outlet 352, along with a separate power output cable. More typically, the fibers 324 would be routed to a fiber management device 380. In the illustrated example, fiber guides 374 are situated in the corners of the interior 324 for routing the optical fibers 324 in the interface device while maintaining a desired bend radius. In certain implementations, the optical fibers 324 are thus received at the cable inlet 350, routed through the IDC housing 358 and the interior 324 of the interface device body 320 to the fiber management device 380.

Figure 11:
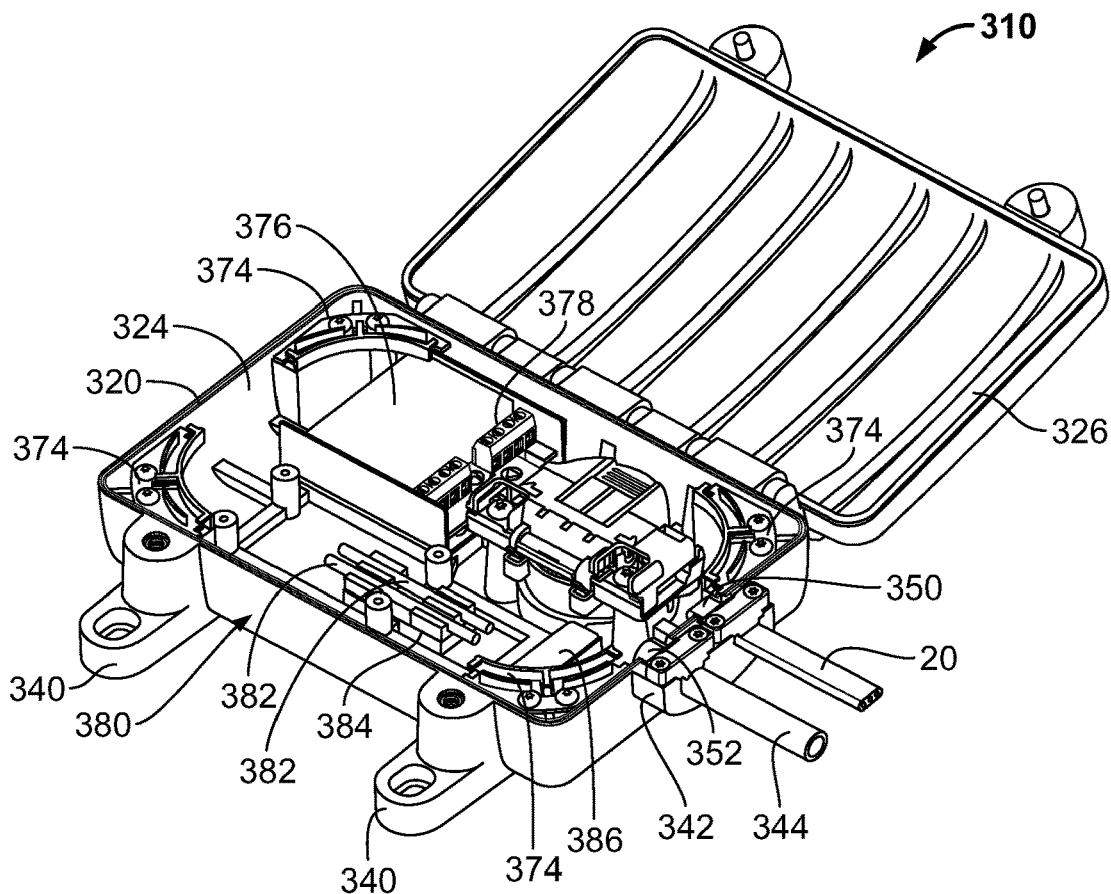
FIG. 11 is a perspective view of the interface device shown in FIG. 7, illustrating an embodiment that includes an optical splice device.
Figure 12:
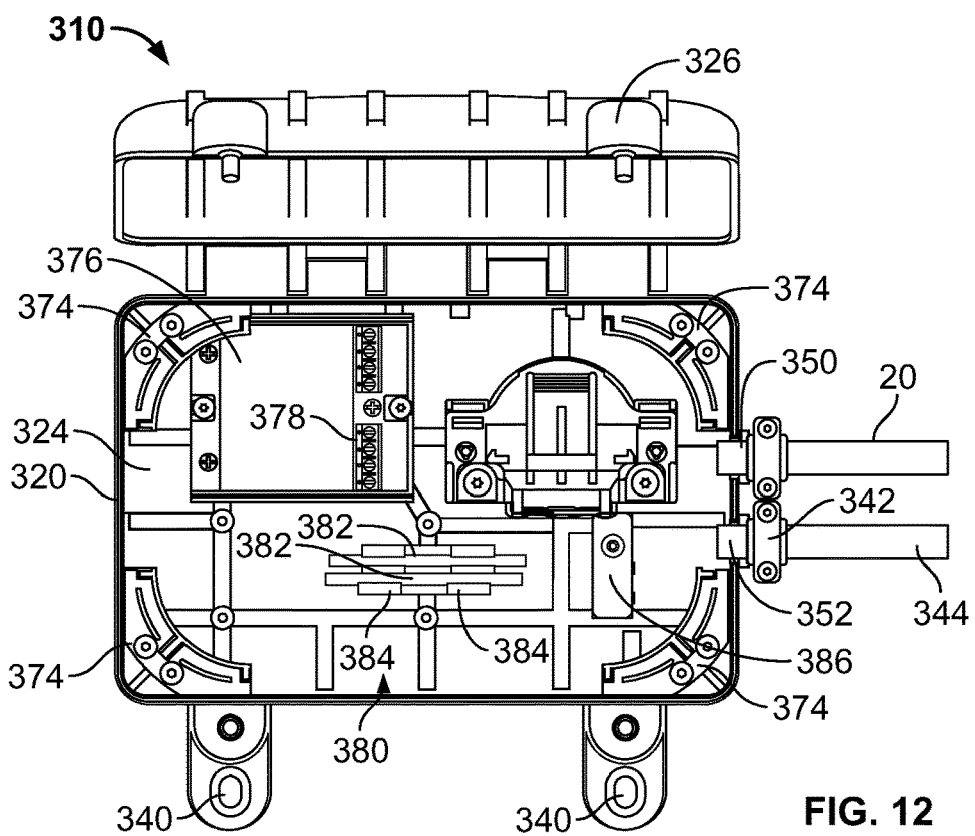
FIG. 12 is a top view of the interface device shown in FIG. 11.

FIGS. 11 and 12 illustrate an example of the interface device 310 wherein the fiber management device 380 includes an optical splice device for making a mechanical or fusion splice, for example. The illustrated fiber management device 380 thus includes furcation tubes 382 situated on splice holders 384. In other implementations, other fiber optic management devices such as fiber optic connectors are provided. A strength member termination 386 is further provided in the embodiment illustrated in FIGS. 11 and 12. The optical fibers 224 can thus be spliced, for example, to a fiber optic pig tail and routed to the cable outlet 352. In some examples, the output cable 244 is also a hybrid cable including optical fibers that are spliced to the fibers 224 using the fiber management device 380, and conductors that receive power from the power converter 376.

Figure 13:
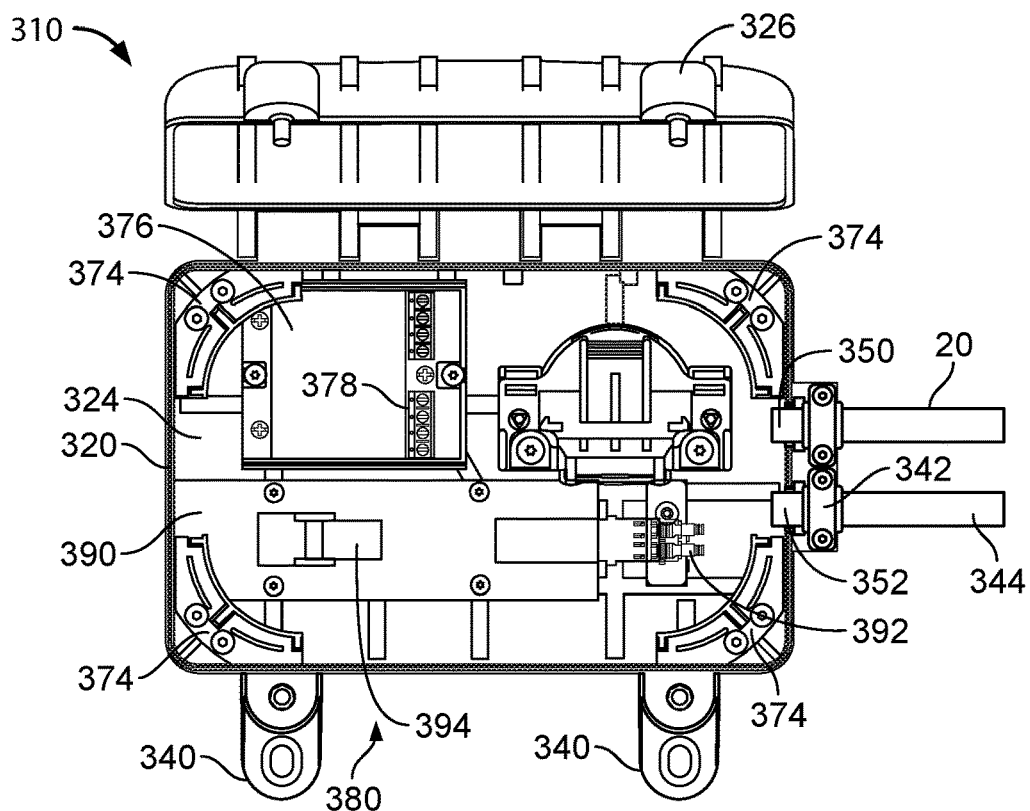
FIG. 13 is a top view of the interface device shown in FIG. 7, illustrating an embodiment that includes a media board.

FIG. 13 illustrates another embodiment where the fiber management device 380 includes a media board 390 that converts optical signals received via the optical fibers 224 to electrical signals. A fiber optic connector 392, such as an LC duplex input connector, is connected to the media board 390 to terminate the optical fibers routed through the interior 324 of the interface device 310 and receive optical signals therefrom. The media board 390 is electrically connected to the IDC 360, either directly, or as in the illustrated embodiment, via the power converter 376. In this manner, the media board is powered by power from the conductors 220,222 terminated by the IDC 360. Additionally, in some embodiments, the media board 390 connects output power and electrical communication signals to a power over Ethernet (PoE) connection. In such embodiments, the output cable 344 is a standard RJ-45 data/power cable that connects to a PoE jack 394 on the media board 390. The RJ-45 cable can then be connected to the desired wireless coverage area defining equipment 12 to provide both communication signals and power thereto.

Some embodiments, for example, include 12 fibers 224 situated in the central passage 216. Typically, two optical fibers 224 are terminated in a given interface device 310. Since the two fibers 224 carrying signals for the desired wireless equipment 12 are to be terminated in the interface device 310, they are cut downstream of the interface device 310. A slit can be cut in the central portion 216 providing an opening through which the desired fibers 224 can be pulled from the central portion and routed to the fiber management device 380. The remaining optical fibers 224 remain intact within the central portion 216, and can be passed through the interface device 310 to another device, for example.

Figure 14:
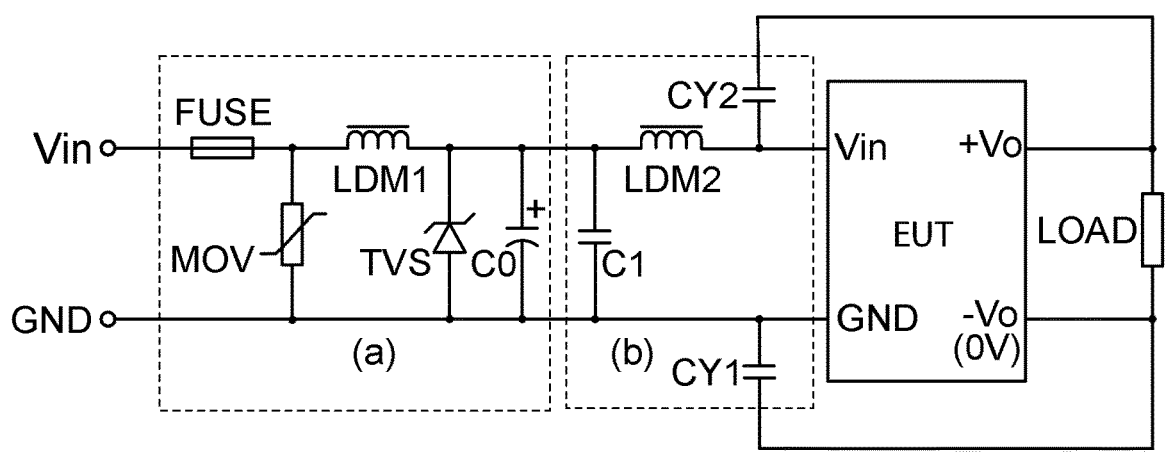
FIG. 14 is a circuit diagram illustrating an example power conditioning circuit.

The power converter 276 provides DC/DC conversion, for example, as well as other power management functions such as circuit overload protection, mains cross protection, lightning protection, etc. In one particular embodiment, a 30 W, 12V output DC-DC converter from CUI Inc. of Tualatin, Oreg. (P/N VYC30W-Q48-S12-T) is used. Other DC-DC converters may be employed based on electrical requirements, packaging, etc. In some implementations, a conditioning circuit is integrated into the interface 310 to minimize voltage ripple. FIG. 14 shows an example of a typical conditioning circuit 400. In further examples, overvoltage protection, such as a gas-tube, is incorporated between the IDC terminals and DC-DC converter input.

Referring back to FIG. 6, the fiber patch panel 302 can receive can receive optical signals from a remote location via a fiber optic trunk cable. Optical fibers of the trunk cable 110 can be separated at a fan-out device, or optical power splitters or wavelength division multiplexers can be used to split optical communications signals from the trunk cable to multiple optical fibers. The fibers can be routed to the patch panel 302, and then to a desired one of the hybrid cables 20, along with electrical power from the power supply 304. In one example, the power supply 304 receives 120 volt or 220 volt alternating current. In one example, power supply 302 includes an AC/DC converter that converts the electrical power from alternating current to direct current. The power supply 304 converts the electrical power from the first voltage (e.g., 120 v or 220 v) to a second voltage that is less than the first voltage. In one example, the second voltage is less than or equal to 60 volts and 100 Watts such that the output voltage complies with NEC Class II requirements.

The hybrid cable 20 can be used to transmit electrical power and optical communication signals from the fiber patch panel 302 and power supply 304 located at a first to the wireless equipment 12 located at a second location. The first end 306 of the hybrid cable 20 can include a first interface for connecting the hybrid cable to electrical power and fiber optic communication at a connector, and the second end 308 of the hybrid cable 20 is received at the cable inlet 350 of the interface device 310. The power converter 376 of the interface device 310 converts electrical power carried by the hybrid cable 20, for example, to a direct current third voltage that is less than the second voltage. In one example, the third voltage corresponds to an electrical voltage requirement of the device 12. In one example, the third voltage is 12V, 24V or 48V.

In some implementations, a converter 312 is associated with the equipment 12 for converting optical signals to electrical signals. In such implementations, the optical fibers and power are provided from the interface device 310 to the converter 312, which provides power and communication signals to the equipment 12. In other implementations, the interface device 310 converts the optical signals to electrical signals using the media board 390, and provides power and electrical communication signals to the equipment 12.

Aspects of the present disclosure relate to powered fiber cable systems capable of simultaneously powering and communicating with wireless coverage area defining equipment (e.g., transceivers, wireless routers, WiFi access points/WiFi hot spots, small cell devices, or like devices). The powered fiber cable system can also be used to power and communicate with other devices such as digital signage, high definition surveillance cameras, and like devices. Moreover, powered fiber cable systems in accordance with the principles of the present disclosure can be incorporated into fiber optic networks (e.g., fiber-to-the-home (FTTH), fiber-to-the-premises (FTTP, fiber-to-the-anything (FTTX)) to provide back-up power or primary power to optical network terminals (ONT) including electronics for providing optical-to-electrical conversion at or near a subscriber location. By providing back-up power using a powered fiber cable system in accordance with the principles of the present disclosure, battery back-ups at the optical network terminals can be eliminated. Powered fiber cable systems in accordance with the principles of the present disclosure are particularly well suited for supporting active devices at outdoor locations where power is not readily available. However, powered fiber cable systems in accordance of the principles of the present disclosure can also be used to support indoor applications such as in local area networks where power and fiber are provided to desk-top locations (e.g., fiber-to-the-desk (FTTD)). Other applications for powered fiber cable systems in accordance with the principles of the present disclosure relate to power-over-Ethernet extensions (PoE or PoE+).

Figure 15:
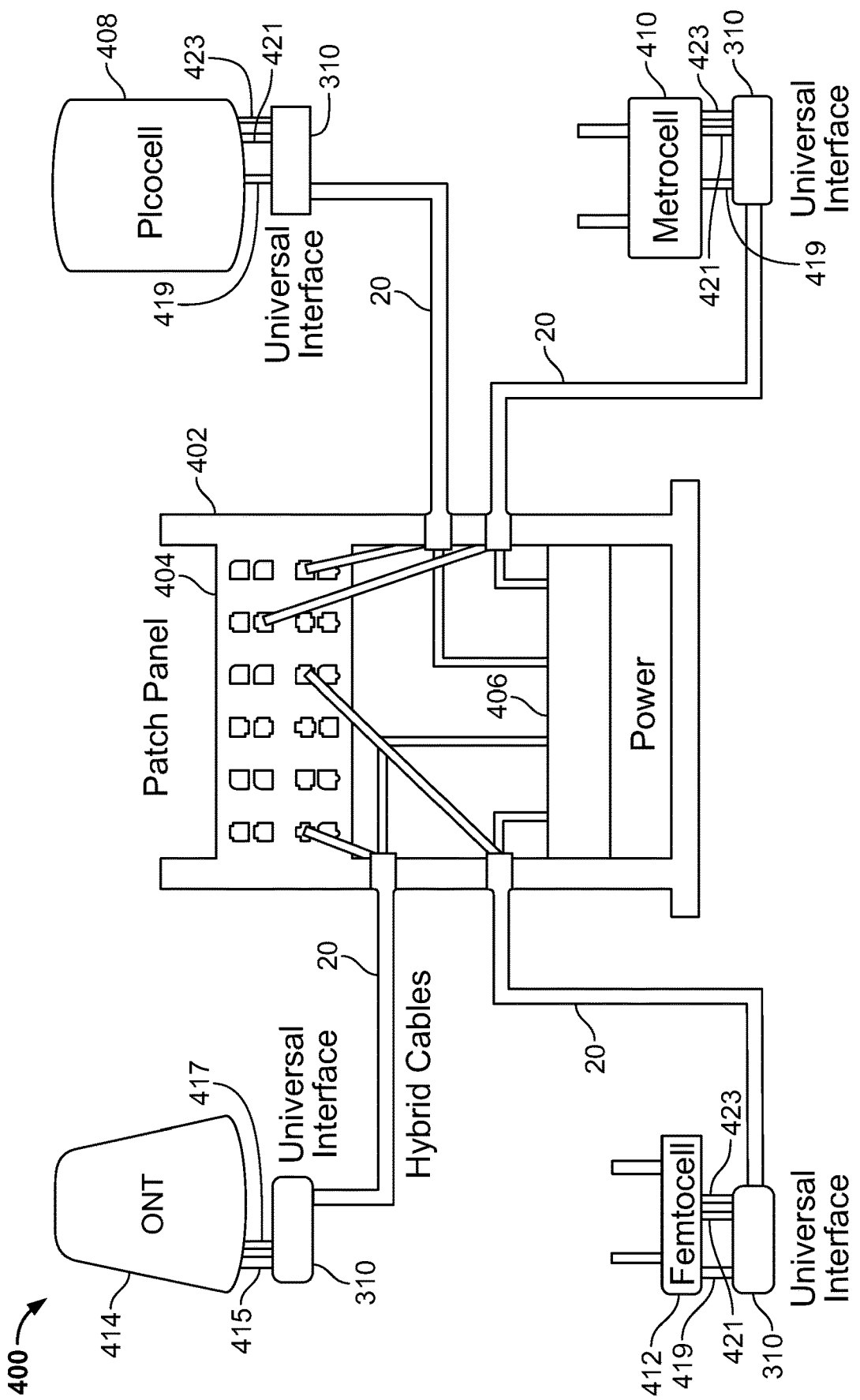
FIG. 15 shows a system in accordance with the principles of the present disclosure having a rack mounted power supply.

Aspects of the present disclosure relate to systems that provide a "rack to device" vision for both powering and communicating with active devices such as small cell devices, ONT's, WiFi hot spots, digital signage, surveillance cameras or like devices in one cable system. FIG. 15 shows an example powered fiber cable system 400 in accordance with the principles of the present disclosure. The powered fiber cable system 400 includes a rack 402 positioned at a location where power (e.g., a power system\grid that typically provides AC power such as a mains power system) and fiber network are available. Such locations where power and fiber optic network communications are available can be referred to as head ends. In certain examples, the power locations (i.e., head ends) can be co-located at a cell site base station, a base station on a building top, in a telecom closet or data center or anywhere where power and access to a fiber optic network are available. As shown at FIG. 15, a patch panel 404 is mounted on the rack 402. The patch panel 404 is coupled to a fiber optic network. For example, optical fibers optically corresponding to fiber optic distribution or feed cables can be connectorized and plugged into fiber optic adapters supported at the patch panel 404. The rack 402 is also shown supporting a power supply unit 406 that in certain examples provides a DC output of 48 volts or less.

In one example, the power supply can include a power express class II power converter shelf manufactured by General Electric. The power supply can include and AC/DC transformer for transforming alternating current (AC) from a mains power supply into DC power for distribution to remotely located active devices. In certain examples, the power supply 406 can power up to 32 hybrid cables 20 in a modular design with four modules and eight cables per module. In certain examples, the power supply is configured to output relatively low voltage DC current (e.g., less than or equal to 48 volts DC). In certain examples, the power source is National Electric Code (NEC) class 2 (as specified by Article 725) and Safety Extra Low Voltage (SELV) compliant. In certain examples, the voltage between any two conductors should not exceed 60 volts DC under normal operating conditions. In certain examples, the power supply is limited to 100 VA. Such low voltage circuits are advantageous because electricians are not required to install such systems, such systems are inherently safe because of the low voltage limits, and such systems can be installed in a conduit-free manner. In certain examples, the power supply can also include circuit protection electronics such as gas discharge tubes, metal oxide varistor components and transient voltage suppression structures/diodes.

As shown at FIG. 15, the patch panel 404 and the power supply 406 are both rack mounted. Optical communication lines from the patch panel 404 and power lines from the power source 406 are coupled to hybrid cables 20 routed to universal interface devices 310 that support active devices such as a picocell 408, a metrocell 410, a femtocell 412 and an ONT 414. The ONT 414 is shown connected to the corresponding interface device 310 by a power line 415 and a separate fiber line 417. The picocell 408, metrocell 410 and femtocell 412 are coupled to their corresponding interface devices 310 by power lines 419 and two fiber lines 421, 423. In other examples, the fiber lines 421, 423 can be replaced with twisted pair conductors for carrying electrical signals in cases where optical to electrical signal conversion occurs at the interface device 310.

Further aspects of the present disclosure relate to a remote interface device (e.g., interface device 310 that is remote from the power supply) for providing an interface between a hybrid cable and a remote active device, the interface device including a closure that houses circuitry for providing electrical power management and including circuit protection electronics. It will be appreciated that the circuitry within the closure is adapted for providing an effective interface between a hybrid cable (e.g., hybrid cable 20) and a remote active device. In certain examples, the closure is designed for outdoor environmental use and includes an environmentally sealed construction. In certain examples, the electrical power management circuitry eliminates the need for line power system design. For example, the electrical power management circuitry can include a DC-to-DC converter suitable for converting power carried by one of the hybrid cables 20 to a voltage and power level compatible with an active device intended to be powered with power from the hybrid cable 20. In certain examples, the DC-to-DC converter can increase the voltage of the power carried by the hybrid cable 20 to a level compatible with the active device powered by the hybrid cable. In certain examples, the increase in voltage provided by the DC-to-DC converter compensates for voltage loss that may occur over the length of the hybrid cable. In certain examples, the DC-to-DC converter raises the voltage level to 12 volts, 24 volts or 48 volts. In certain other examples, the DC-to-DC converter decreases the voltage level to a level compatible with the active device intended to be powered by the hybrid cable. In certain examples, the power is converted so as to become compatible with a 25 watt device, a 30 watt device, or a 45 watt device. In certain examples, the closure also houses an optical-to-electrical converter that converts optical signals from the hybrid cable to electrical signals that are transmitted to the active device. In certain examples, the electrical signals and the power can be transmitted from the interface device to the active device by a twisted pair Ethernet cable so as to provide power-over-Ethernet or power-over-Ethernet-plus connectivity.

As indicated above, the closure of the interface device can enclose circuit protection electronics. For example, the circuit protection electronics can include primary electrical protection that may include a gas discharge tube rated to at least 40 kAmp surge/overvoltage protection. Such structure can provide protection with respect to lightning strikes and line cross-overs. The electrical protection can also include secondary electrical protection that may be rated to 4.5 kAmp and that may include metal oxide varistor components that couple to ground in response to voltage surges. The electrical protection may also include tertiary protection that prevents voltage from rising above a predetermined level (e.g., 80 volts, or 100 volts). In certain examples, the tertiary protection can include a transient voltage suppression diode. In certain examples, fast acting fuses can be used.

Cables in accordance with the principles of the present disclosure can provide power over relatively long distances. For example, using 12 gauge conductors in the hybrid cable and using conversion circuitry in the interface device that converts the optical signals and power to a PoE format, the system can provide 10 Watts of power over a length of 3,000 meters, 15 Watts of power over 2,400 meters, 20 Watts of power over 1,900 meters and 25 Watts of power over 1,600 meters. If power is provided in a non-power over Ethernet format (e.g., via an M8 plug or other power lines separate from the communications lines), 30 watt power can be provided up to 1,600 meters and 45 watt power can be provided up to 1,000 meters. A system that utilizes 16 gauge conductors and outputs power in a power over Ethernet format can provide 10 watts of power at 1,200 meters, 15 watts of power at 960 meters, 20 watts of power at 760 meters, and 25 watts of power at 640 meters. By not using a power over Ethernet format and instead keeping the power separate from the communications via a separate power line, the 16 gauge wire can provide 30 watts of power at 640 meters and 45 watts of power at 400 meters.

Aspects of the present disclosure relate to interface closures that can be readily customized to meet customer requirements. In certain examples, the closures can be environmentally sealed and can include clamps for clamping hybrid cables such as the hybrid cable 20. The closures can also include power management circuitry such as power converters (e.g., DC-to-DC power converters). The power converters can be customized to comply with the power requirements of the remote device intended to be powered by the customer. In certain examples, the power conversion circuitry can be modular and modules providing different levels of conversion can be selected and plugged into the circuit board of the closure to satisfy the customer requirement. For example, power converters capable of outputting 12, 24 or 48 volts can be used. It will be appreciated that the format of the power output from the interface closure can also be customized to meet customer needs. For example, the interface closure can be configured to output power and communications over a variety of formats such as: (a) power-over-Ethernet; (b) power-over-Ethernet-Plus; (c) separate power (e.g., via a cable terminated with an M8 plug or other configuration) and Ethernet lines (e.g., terminated with RJ45 connectors or other connectors); (d) separate fiber lines for communications and power lines for power (e.g., terminated with M8 connectors or other power connectors); (e) a hybrid cable having optical fibers for optical signals and electrical conductors for power that can be terminated with a hybrid connector or can have separate fiber and power pigtails; or (f) a cable having twisted pair conductors for carrying communication signals and separate electrical conductors for power that can be terminated by separate RJ-style connectors for communication signals and an M8 plug for power or other connector arrangements. In the case where separate fiber lines are used, the fiber lines can be terminated with different styles of fiber optic connectors such as LC connectors, SC connectors, or other fiber optic connectors. In certain examples, the fiber optic connectors can be ruggedized and can include environmental sealing as well as twists-to-lock fastening elements such as threaded fasteners or bayonet-style fasteners. In the case of Ethernet cable, standard RJ-45 connectors or ruggedized RJ-45 connectors can be used. For pigtails carrying only power, stranded or solid conductors can be used. Additionally, the power pigtails can be terminated with power connectors such as M8 connectors.

Figure 16:
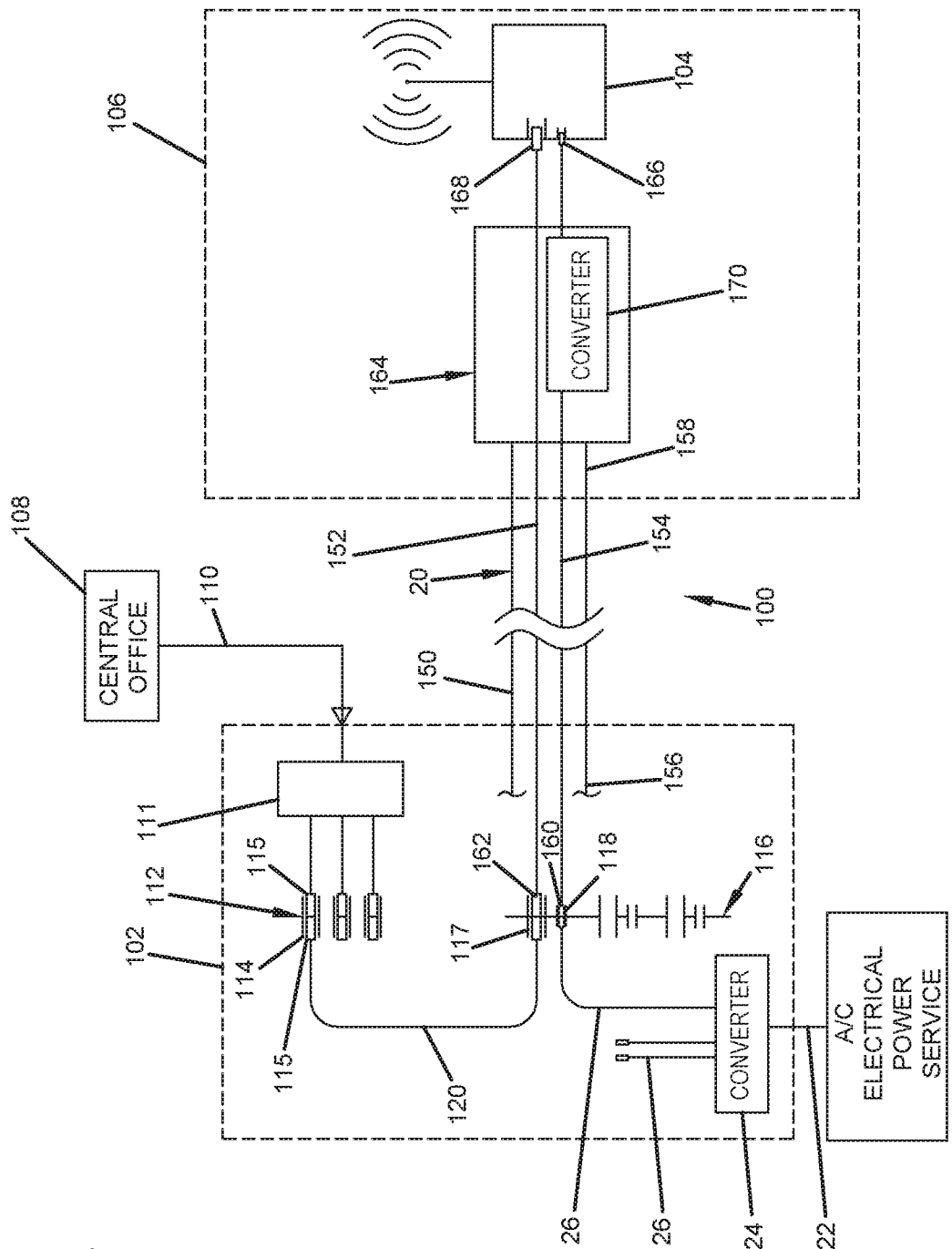
FIG. 16 shows a hybrid cable system in accordance with the principles of the present disclosure.

FIG. 16 shows a cable system 100 that can be used to transmit power and communications from a first location 102 to an active device 104 at a second location 106. The second location 106 is remote from the first location 102. In certain example, the first location 102 can be a base location and the active device 104 can include wireless coverage area defining equipment. Examples of wireless coverage area defining equipment and locations where such equipment may be installed are described above. Examples of other types of active devices include cameras such as high definition video cameras.

The first location 102 receives optical signals from a remote location 108 via a fiber optic trunk cable 110. Optical fibers of the trunk cable 110 can be separated at a fan-out device 111 at the first location. Alternatively, optical power splitters or wavelength division multi-plexers can be used to split optical communications signals from the trunk cable 110 to multiple optical fibers. The fibers can be routed to a patch panel 112 having fiber optic adapters 114 (i.e., structures for optically and mechanically interconnecting two fiber optic connectors 115). The first location 102 can also include a combined power/communication panel 116 having fiber optic adapters 117 paired with power adapters 118 (i.e., ports). Connectorized fiber optic patch cords 120 can be routed from the fiber optic adapters 114 to the fiber optic adapters 117.

The first location 102 can receive electrical power from a main power line 122. In one example the main power line 122 can be part of a mains power system that provides 100-240 nominal volt alternating current (example frequencies include 50 and 60 Hertz). The first location 102 can include a converter 124 for converting the electrical power from the first voltage (e.g., 100 v, 120 v, 220 v, 230 v, 240 v etc. nominal voltage) to a second voltage that is less than the first voltage. In one example, the second voltage is less than or equal to 60 volts and less than or equal to 100 Watts such that the output voltage complies with NEC Class II requirements. In one example, the converter 124 is an AC/DC converter that converts the electrical power from alternating current to direct current. Connectorized power cords 126 can be used to route electrical power having the second voltage from the converter 124 to the power adapters 118. In certain examples, the combined power/communications panel 116 can include at least 18, 24, 30 or 32 fiber optic adapters paired with corresponding power adapters 118. In certain examples, the converter 124 is large enough to provide NEC Class II compliant power through separate hybrid cables to at least 18, 24, 30 or 32 active devices. Of course, converter having smaller capacities could be used as well. Additionally, the converter 124 can be part of a voltage conversion package including overvoltage protection that provides protection/grounding in the event of lightning strikes and main crosses.

A hybrid cable 20 can be used to transmit electrical power and optical communication signals between the first and second locations 102, 106. The hybrid cable 20 can include an outer jacket 150 containing at least one optical fiber 152 for carrying the optical communication signals and electrical conductors 154 (e.g., wires such as ground and power wires) for transmitting the electrical power having the second voltage. The hybrid cable 20 can include a first end 156 and a second end 158. The first end 156 can include a first interface for connecting the hybrid cable to electrical power and fiber optic communication at the first location 102. In one example, the first interface can include a power connector 160 (e.g., a plug) that connects the electrical conductors 154 to one of the connectorized power cords 126 at the power/communications panel 116. The power connector 160 can be plugged into the adapter 118 and can be provided at a free end of a cord that extends outwardly from the outer jacket 150 at the first end of the hybrid cable 20. The cord can contain the electrical conductors 154. The first interface can also include a fiber optic connector 162 (e.g., an SC connector, LC connector, ST-style connector or other type of connector) that connects the optical fiber 152 to one of the patch cords 120. The fiber optic connector 162 can plug into one of the fiber optic adapters 117 and can be mounted at the free end of a cord that contains the optical fiber 152 and extends outwardly from the outer jacket 150 at the first end of the hybrid cable 20.

The second end 158 of the hybrid cable 20 can include a second interface for connecting the hybrid cable 20 to the active device 104 such that electrical power is provided to the active device 104 and such that fiber optic communication signals can be transmitted between the first and second locations 102, 106. The second interface includes an interface structure 164 including a power connection location 166 and a communication connection location 168. In one example, the interface structure 164 includes a power converter 170 for converting electrical power carried by the hybrid cable 20 to a direct current third voltage that is less than the second voltage. In one example, the third voltage corresponds to an electrical voltage requirement of the active device 104. In one example, the power converter 170 is a DC/DC converter. In one example, the third voltage is 12V, 24V or 48V. In examples where AC current is transmitted by the hybrid cable 20, the power converter 124 can be an AC/AC converter and the power converter 170 can be an AC/DC converter. In certain examples, the interface structure 164 can include an optical-to-electrical converter for converting the communications signals carried by the optical fiber 152 from an optical form to an electrical form. In other examples, optical-to-electrical conversion can be performed by the active device 104 or can take place between the active device 104 and the interface structure 164.

In one example, the interface structure 164 includes a converter interface that allows power converters 170 with different conversion ratios to interface and be compatible with the interface structure 164. The conversion ratio of the particular power converter 170 used can be selected based on factors such as the voltage requirement of the active device 104 and the length of the hybrid cable 20. The power converters 170 can have a modular configuration can be installed within the interface structure 168 in the field or in the factory. In one example, the power converters 170 can have a "plug-and-play" interface with the interface structure. The modular configuration also allows the power converter 170 to be easily replaced with another power converter 170, if necessary. In certain examples, the interface structure 164 can include overvoltage protection and grounding arrangements such as fuses, metal oxide varistors, gas tubes or combinations thereof.

In one example, the electrical power having the third voltage can be output to the active device 104 through the power connection location 166. The power connection location 166 can include a power connector, a power port, a power cord or like structures for facilitating connecting power to the active device 104. In one example, the power connection location 166 can have a modular configuration that allows interface connectors having different form factors to be used.

In one example, the communications signals can be transferred between the hybrid cable 20 and the active device through the communication connection location 168. The communication connection location 168 can include a connector, a port, a cord or like structures for facilitating connecting to the active device 104. In one example, the communication connection location 168 can have a modular configuration that allows interface connectors having different form factors to be used. In the case where the optical to electrical converter is provided within the interface structure 164, the connection location can include electrical communication type connectors (e.g., plugs or jacks) such as RJ style connectors. In the case where the optical to electrical converter is provided at the active device 104, the communication connection location 168 can include fiber optic connectors and or fiber optic adapters (e.g., SC connectors/adapters; LC connectors/adapters, etc.). In certain examples, ruggedized, environmentally sealed connectors/adapters can be used (e.g., see U.S. Pat. Nos. 8,556,520; 7,264,402; 7,090,407; and 7,744,286 which are hereby incorporated by reference in their entireties. It will be appreciated that when the active devices include wireless transceivers, the active devices can receive wireless signals from the coverage area and such signals can be carried from the active devices to the base station 11 via the hybrid cables. Also, the active devices can covert signals received from the hybrid cables into wireless signals that are broadcasted/transmitted over the coverage area.

In one example, the second voltage is less than the first voltage and greater than the third voltage. The third voltage is the voltage required by the active device at the second location. In one example, the second voltage is sufficiently larger than the third voltage to account for inherent voltage losses that occur along the length of the hybrid cable.

Various modifications and alterations of this disclosure may become apparent to those skilled in the art without departing from the scope and spirit of this disclosure, and it should be understood that the scope of this disclosure is not to be unduly limited to the illustrative examples set forth herein.

What is claimed is:

1. A power and data transmission system, comprising:
a hybrid cable having an electrical conductor and an optical fiber; and
an independent interface structure having a housing that includes a DC-DC power converter and an optical-to-electrical converter,
wherein the electrical conductor of the hybrid cable transmits a supplied DC power having a first DC voltage to the DC-DC power converter of the independent interface structure,
wherein the DC-DC power converter converts the first DC voltage to a second DC voltage that is provided to a power interface of an active device, the active device having a housing that is distinct from the housing of the independent interface structure,
wherein the optical fiber transmits a supplied optical communication signal to the optical-to-electrical converter of the independent interface structure, and
wherein the optical-to-electrical converter converts the supplied optical communication signal to an electrical communication signal that is provided to a communication interface of the same active device.

2. The power and data transmission system of claim 1, wherein the first DC voltage is greater than the second DC voltage.

3. The power and data transmission system of claim 1, wherein the first DC voltage is less than the second DC voltage.

4. The power and data transmission system of claim 1, wherein the independent interface structure includes overvoltage protection.

5. The power and data transmission system of claim 1, wherein a conversion ratio of the DC-DC power converter of the independent interface structure is selected to correspond to an electrical voltage requirement of a pre-determined active device.

6. The power and data transmission system of claim 1, wherein the interface structure is compatible with both a DC-DC power converter having a first conversion ratio and a DC-DC power converter having a second conversion ratio that is different from the first conversion ratio.

7. The power and data transmission system of claim 6, wherein the DC-DC power converter having the first conversion ratio and the DC-DC power converter having the second conversion ratio comprise "plug-and-play" power converters enabling their replacement within the interface structure with a different DC-DC power converter having a same or different conversion ratio.

8. The power and data transmission system of claim 1, wherein the communication interface of the active device comprises an RJ style connector interface.

9. The power and data transmission system of claim 1, wherein the active device power interface and the active device communication interface are combined in a power over Ethernet (PoE) interface.

10. The power and data transmission system of claim 1, wherein the active device comprises at least one of a wireless transmitter device, a camera and an optical network terminal (ONT).

11. The power and data transmission system of claim 1, wherein the first DC voltage is supplied by an AC-DC converter having converted an AC voltage of a mains power line to the first DC voltage.

12. A method of delivering power and data to a device, comprising:
supplying an optical communication signal to an optical fiber of a hybrid cable;
supplying DC power to an electrical conductor of the same hybrid cable;
transmitting the optical communication signal and the DC power over the hybrid cable to an independent interface structure having a housing that includes both an optical to electrical converter and a DC-DC power converter;
converting a DC voltage of the DC power to a different DC voltage with the DC-DC power converter;
converting the optical communication signal to an electrical communication signal with the optical to electrical converter;
delivering from the independent interface structure to an active device, which utilizes both power and a communication signal during operation, the different DC voltage and the electrical communication signal, the active device having a housing that is distinct from the housing of the independent interface structure.

13. The method of claim 12, wherein the DC voltage is greater than the different DC voltage.

14. The method of claim 12, wherein the DC voltage is less than the different DC voltage.

15. The method of claim 12, wherein the interface structure is compatible with both a DC-DC power converter having a first conversion ratio and a DC-DC power converter having a second conversion ratio that is different from the first conversion ratio.

16. The method of claim 15, wherein the DC-DC power converter having the first conversion ratio and the DC-DC power converter having the second conversion ratio comprise "plug-and-play" power converters enabling their replacement within the interface structure with a different DC-DC power converter having a same or different conversion ratio.

17. The method of claim 12, wherein the different DC voltage and the electrical communication signal delivered from the interface structure to the active device is delivered via a power over Ethernet (PoE) cable.

18. The method of claim 12, wherein the electrical communication signal delivered from the interface structure to the active device is delivered via a cable having an RJ style connector interface.

19. A power and data transmission system, comprising:
a hybrid cable having an electrical conductor and an optical fiber; and
an independent interface structure that includes a DC-DC power converter and an optical-to-electrical converter,
wherein the electrical conductor of the hybrid cable transmits a supplied DC power having a first DC voltage to the DC-DC power converter of the independent interface structure,
wherein the DC-DC power converter converts the first DC voltage to a second DC voltage that is provided to a power interface of an active device, wherein the optical fiber transmits a supplied optical communication signal to the optical-to-electrical converter of the independent interface structure, wherein the optical-to-electrical converter converts the supplied optical communication signal to an electrical communication signal that is provided to a communication interface of the same active device, wherein the independent interface structure comprises an enclosure with a lid having an open and closed position, the enclosure including an insulation displacement connector (IDC) having an IDC terminal, wherein the lid in the closed position presses the IDC terminal into electrical contact with the electrical conductor of the hybrid cable.

20. A power and data transmission system, comprising:
a hybrid cable having an electrical conductor and an optical fiber; and
an independent interface structure having a housing that includes a DC-DC power converter and either an optical-to-electrical converter or a fiber pass-through,
wherein the electrical conductor of the hybrid cable transmits a supplied DC power having a first DC voltage to the DC-DC power converter of the independent interface structure,
wherein the DC-DC power converter converts the first DC voltage to a second DC voltage that is provided to a power interface of an active device, the active device having a housing that is distinct from the housing of the independent interface structure,
wherein the optical fiber transmits a supplied optical communication signal to the optical-to-electrical converter or the fiber pass-through of the independent interface structure, and
wherein an output of the optical-to-electrical converter or an output of the fiber pass-through is provided to a communication interface of the same active device.

21. The power and data transmission system of claim 20, wherein the housing of the independent interface structure is environmentally sealed.

22. The power and data transmission system of claim 20, wherein the first DC voltage is greater than the second DC voltage.

23. The power and data transmission system of claim 20, wherein the first DC voltage is less than the second DC voltage.

24. The power and data transmission system of claim 20, wherein the independent interface structure includes overvoltage protection.

25. The power and data transmission system of claim 20, wherein a conversion ratio of the DC-DC power converter of the independent interface structure corresponds to an electrical voltage requirement of a pre-determined active device.

26. The power and data transmission system of claim 20, wherein the interface structure is compatible with both a DC-DC power converter having a first conversion ratio and a DC-DC power converter having a second conversion ratio that is different from the first conversion ratio.

27. The power and data transmission system of claim 26, wherein the DC-DC power converter having the first conversion ratio and the DC-DC power converter having the second conversion ratio comprise "plug-and-play" power converters enabling their replacement within the interface structure with a different DC-DC power converter having a same or different conversion ratio.

28. The power and data transmission system of claim 20, wherein the communication interface of the active device comprises an RJ style connector interface.

29. The power and data transmission system of claim 20, wherein the active device power interface and the active device communication interface are combined in a power over Ethernet (PoE) interface.

30. The power and data transmission system of claim 20, wherein the active device comprises at least one of a wireless transmitter device, a camera and an optical network terminal (ONT).

31. The power and data transmission system of claim 20, wherein the first DC voltage is supplied by an AC-DC converter having converted an AC voltage of a mains power line to the first DC voltage.

32. The method of delivering power and data to a device of claim 12, wherein the housing of the independent interface structure is environmentally sealed.

33. The power and data transmission system of claim 19, wherein the enclosure of the independent interface structure is environmentally sealed.

34. The power and data transmission system of claim 1, wherein the housing of the independent interface structure is environmentally sealed.

* * * * *